US012761767B2

(12) United States Patent
Yan et al.

(10) Patent No.: US 12,761,767 B2
(45) Date of Patent: Oct. 13, 2026

(54) TOUCH SUBSTRATE, TOUCH DISPLAY PANEL AND TOUCH DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Jun Yan, Beijing (CN); Fan He, Beijing (CN); Kemeng Tong, Beijing (CN); Qiwei Wang, Beijing (CN); Rong Wang, Beijing (CN); Yi He, Beijing (CN); Xiangdan Dong, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 19/333,160

(22) Filed: Sep. 18, 2025

(65) Prior Publication Data

US 2026/0016922 A1 Jan. 15, 2026

Related U.S. Application Data

(63) Continuation of application No. 18/695,766, filed as application No. PCT/CN2022/141139 on Dec. 22, 2022, now Pat. No. 12,474,808.

(51) Int. Cl.

*G06F 3/044* (2006.01)
*G06F 3/0354* (2013.01)

(Continued)

(52) U.S. Cl.

CPC ........ *G06F 3/0446* (2019.05); *G06F 3/03545* (2013.01); *G06F 3/04164* (2019.05);

(Continued)

(58) Field of Classification Search

CPC ............... G06F 3/0446; G06F 3/04164; G06F 3/03545; G06F 2203/04102;

(Continued)

(56) References Cited

U.S. PATENT DOCUMENTS

2002/0089493 A1* 7/2002 Hong ...................... G06F 3/041 345/173
2011/0095999 A1* 4/2011 Hayton ................. G06F 1/1652 345/206

(Continued)

FOREIGN PATENT DOCUMENTS

WO 2018086201 A1 5/2018

OTHER PUBLICATIONS

First Office Action issued on Jul. 29, 2026 for application No. IN202447087407.

*Primary Examiner* — Mark Edwards
(74) *Attorney, Agent, or Firm* — Nath, Goldberg & Meyer; Joshua B. Goldberg

(57) ABSTRACT

Embodiments of the present disclosure provide a touch substrate, a touch display panel and a touch display apparatus. The touch display panel includes: a base substrate; a touch electrode layer on the base substrate and in a touch display region, the touch electrode layer including touch electrodes in the same layer and insulated from each other; and touch leads on the base substrate, each touch lead is electrically connected to a corresponding one touch electrode, some touch leads extend from the touch display region through the first bending region to the first binding region, and are bent to the back of the touch display panel in the first (Continued)

bending region, and the other touch leads extend from the touch display region through the second bending region to the second binding region, and are bent to the back of the touch display panel in the second bending region.

20 Claims, 13 Drawing Sheets

(51) Int. Cl.
*G06F 3/041* (2006.01)
*H10K 59/40* (2023.01)

(52) U.S. Cl.
CPC .............. *G06F 2203/04102* (2013.01); *G06F 2203/04107* (2013.01); *G06F 2203/04111* (2013.01); *H10K 59/40* (2023.02)

(58) Field of Classification Search
CPC . G06F 2203/04107; G06F 2203/04111; H10K 59/40
USPC .......................................................... 345/173
See application file for complete search history.

(56) References Cited

U.S. PATENT DOCUMENTS

| | | | | |
|---|---|---|---|---|
| 2014/0092041 | A1* | 4/2014 | Ih | G06F 3/0412 345/173 |
| 2016/0066409 | A1* | 3/2016 | Kwon | H10K 59/40 174/254 |
| 2020/0117311 | A1* | 4/2020 | Wu | G06F 3/0446 |
| 2020/0201509 | A1* | 6/2020 | Kadowaki | G06F 3/03545 |
| 2021/0181888 | A1 | 6/2021 | Yan et al. | |
| 2021/0200363 | A1* | 7/2021 | Lee | G06F 3/0445 |
| 2021/0273198 | A1* | 9/2021 | Cheng | H10K 59/40 |
| 2022/0137739 | A1* | 5/2022 | Park | H05K 1/181 345/156 |
| 2022/0413644 | A1* | 12/2022 | Rhe | G06F 3/0445 |

* cited by examiner

TOUCH SUBSTRATE, TOUCH DISPLAY PANEL AND TOUCH DISPLAY APPARATUS

This is a continuation application of U.S. patent application Ser. No. 18/695,766, filed on Mar. 26, 2024, a National Phase Application filed under 35 U.S.C. 371 as a national stage of PCT/CN2022/141139 filed on Dec. 22, 2022, the content of which is hereby incorporated by reference in its entirety.

TECHNICAL FIELD

The present disclosure relates to the field of touch display technology, and in particular to a touch substrate, a touch display panel and a touch display apparatus.

BACKGROUND

With the continuous development of electronic products, an AMOLED (Active Matrix Organic Light-Emitting Diode) display apparatus may realize a full screen, a narrow bezel, a high resolution, rollable wearing, folding, and the like, and therefore, is widely applied. The technology (Flexible Multi-Layer On Cell, FMLOC) of directly forming a touch structure on an encapsulation layer of an OLED (Organic Light-Emitting Diode) display panel may form a lighter and thinner display apparatus, and may be applied to a folded and rollable OLED display apparatus.

SUMMARY OF THE INVENTION

Embodiments of the present disclosure provide a touch substrate, a touch display panel and a touch display apparatus, as follows:

Embodiments of the present disclosure provide a touch display panel, including a touch display region and a peripheral region surrounding the touch display region, the peripheral region includes: a first binding region and a second binding region on opposite sides of the touch display region, a first bending region between the first binding region and the touch display region, and a second bending region between the second binding region and the touch display region; the touch display panel further includes: a base substrate; a touch electrode layer on the base substrate and in the touch display region, wherein the touch electrode layer includes a plurality of touch electrodes in the same layer and insulated from each other; and a plurality of touch leads on the base substrate, wherein each touch lead is electrically connected to a corresponding one of the plurality of touch electrodes, some touch leads extend from the touch display region through the first bending region to the first binding region, and are bent to the back of the touch display panel in the first bending region, and the other touch leads extend from the touch display region through the second bending region to the second binding region, and are bent to the back of the touch display panel in the second bending region.

In some implementations, in the touch display panel provided by the embodiment of the present disclosure, the plurality of touch electrodes include a plurality of first touch electrodes and a plurality of second touch electrodes crossing each other in a horizontal direction and a vertical direction, the plurality of touch leads include first leads and second leads, and the first binding region and the second binding region are respectively located at two ends of the plurality of second touch electrodes in an extending direction of the plurality of second touch electrodes; each of the first leads is electrically connected to a first end of a corresponding one of the plurality of first touch electrodes, some first leads extend from the touch display region through the first bending region to the first binding region, and the other first leads extend from the touch display region through the second bending region to the second binding region; and each of the second leads is electrically connected to a first end of a corresponding one of the plurality of second touch electrodes, and the second leads extend from the touch display region through the first bending region adjacent to the second leads to the first binding region.

In some implementations, in the touch display panel provided by the embodiment of the present disclosure, the plurality of touch leads further includes third leads and fourth leads, each of the third leads is electrically connected to a second end of a corresponding one of the plurality of first touch electrodes, some third leads extend from the touch display region through the first bending region to the first binding region, and the other third leads extend from the touch display region through the second bending region to the second binding region; and each of the fourth leads is electrically connected to a second end of a corresponding one of the plurality of second touch electrodes, and the fourth leads extend from the touch display region through the second bending region adjacent to the fourth leads to the second binding region.

In some implementations, in the touch display panel provided by the embodiment of the present disclosure, the first binding region includes a first binding sub-region and a second binding sub-region that are independently provided, the first binding sub-region is close to the first end of the first touch electrode, and the second binding sub-region is close to the second end of the first touch electrode; some first leads extend from the touch display region through the first bending region to a side of the first binding sub-region close to the first end of the first touch electrode, and some third leads extend from the touch display region through the first bending region to a side of the second binding sub-region close to the second end of the first touch electrode; and some second leads extend from the touch display region through the first bending region to a side of the first binding sub-region away from the first end of the first touch electrode, and the other second leads extend from the touch display region through the first bending region to a side of the second binding sub-region away from the second end of the first touch electrode.

In some implementations, in the touch display panel provided by the embodiment of the present disclosure, the second binding region includes a third binding sub-region and a fourth binding sub-region that are independently provided, the third binding sub-region is close to the first end of the first touch electrode, and the fourth binding sub-region is close to the second end of the first touch electrode; the other first leads extend from the touch display region through the second bending region to a side of the third binding sub-region close to the first end of the first touch electrode, and the other third leads extend from the touch display region through the second bending region to a side of the fourth binding sub-region close to the second end of the first touch electrode; and some fourth leads extend from the touch display region through the second bending region to a side of the third binding sub-region away from the first end of the first touch electrode, and the other fourth leads extend from the touch display region through the second bending region to a side of the fourth binding sub-region away from the second end of the first touch electrode.

In some implementations, in the touch display panel provided by the embodiment of the present disclosure, the second binding region includes a fifth binding sub-region, a sixth binding sub-region, a seventh binding sub-region, and an eighth binding sub-region, which are sequentially arranged and independently provided along the extending direction of the first touch electrode; the other first leads extend from the touch display region through the second bending region to a side of the fifth binding sub-region close to the first end of the first touch electrode, and the other third leads extend from the touch display region through the second bending region to a side of the eighth binding sub-region close to the second end of the first touch electrode; and the fourth leads are sequentially divided into a first group of fourth leads, a second group of fourth leads, a third group of fourth leads and a fourth group of fourth leads along the extending direction of the first touch electrode, the first group of fourth leads extend from the touch display region through the second bending region to a side of the fifth binding sub-region away from the first end of the first touch electrode, the second group of fourth leads extend from the touch display region through the second bending region to a side of the sixth binding sub-region close to the first end of the first touch electrode, the third group of fourth leads extend from the touch display region through the second bending region to a side of the seventh binding sub-region close to the second end of the first touch electrode, and the fourth group of fourth leads extend from the touch display region through the second bending region to a side of the eighth binding sub-region away from the second end of the first touch electrode.

In some implementations, in the touch display panel provided by the embodiment of the present disclosure, the first binding region is in a central region of the peripheral region at the first end of the second touch electrode, and is divided into a first region, a second region, a third region and a fourth region sequentially arranged along the extending direction of the first touch electrode, and the first region is close to the first end of the first touch electrode; some first leads extend from the touch display region through the first bending region to the first region, and some third leads extend from the touch display region through the first bending region to the fourth region; and some second leads extend from the touch display region through the first bending region to the second region, and the other second leads extend from the touch display region through the first bending region to the third region.

In some implementations, in the touch display panel provided by the embodiment of the present disclosure, the second binding region includes a ninth binding sub-region, a tenth binding sub-region, an eleventh binding sub-region, and a twelfth binding sub-region sequentially arranged and independently provided along the extending direction of the first touch electrode; the other first leads extend from the touch display region through the second bending region to a side of the ninth binding sub-region close to the first end of the first touch electrode, and the other third leads extend from the touch display region through the second bending region to a side of the twelfth binding sub-region close to the second end of the first touch electrode; and the fourth leads are sequentially divided into a fifth group of fourth leads, a sixth group of fourth leads, a seventh group of fourth leads, and an eighth group of fourth leads along the extending direction of the first touch electrode, the fifth group of fourth leads extend from the touch display region through the second bending region to a side of the ninth binding sub-region away from the first end of the first touch electrode, the sixth group of fourth leads extend from the touch display region through the second bending region to a side of the tenth binding sub-region close to the first end of the first touch electrode, the seventh group of fourth leads extend from the touch display region through the second bending region to a side of the eleventh binding sub-region close to the second end of the first touch electrode, and the eighth group of fourth leads extend from the touch display region through the second bending region to a side of the twelfth binding sub-region away from the second end of the first touch electrode.

In some implementations, in the touch display panel provided by the embodiment of the present disclosure, the second binding region is in a central region of the peripheral region at the second end of the second touch electrode, and is divided into a fifth region, a sixth region, a seventh region and an eighth region sequentially arranged along the extending direction of the first touch electrode, and the fifth region is close to the first end of the first touch electrode; the other first leads extend from the touch display region through the second bending region to the fifth region, and the other third leads extend from the touch display region through the second bending region to the eighth region; and some fourth leads extend from the touch display region through the second bending region to the sixth region, and the other fourth leads extend from the touch display region through the second bending region to the seventh region.

In some implementations, in the touch display panel provided by the embodiment of the present disclosure, a gap between the first lead electrically connected to the first touch electrode closest to the first end of the second touch electrode and the second lead electrically connected to the second touch electrode closest to the first end of the first touch electrode is a first gap, and a width of the first gap is greater than or equal to 70 μm; a gap between the third lead electrically connected to the first touch electrode closest to the first end of the second touch electrode and the second lead electrically connected to the second touch electrode closest to the second end of the first touch electrode is a second gap, and a width of the second gap is greater than or equal to 70 μm; a gap between the first lead electrically connected to the first touch electrode closest to the second end of the second touch electrode and the fourth lead electrically connected to the second touch electrode closest to the first end of the first touch electrode is a third gap, and a width of the third gap is greater than or equal to 70 μm; and a gap between the third lead electrically connected to the first touch electrode closest to the second end of the second touch electrode and the fourth lead electrically connected to the second touch electrode closest to the second end of the first touch electrode is a fourth gap, and a width of the fourth gap is greater than or equal to 70 μm.

In some implementations, in the touch display panel provided by the embodiment of the present disclosure, the first gap is provided with a first shielding line therein which is grounded, the second gap is provided with a second shielding line therein which is grounded, the third gap is provided with a third shielding line therein which is grounded, and the fourth gap is provided with a fourth shielding line therein which is grounded.

In some implementations, in the touch display panel provided by the embodiment of the present disclosure, some first leads cross over the first bending region to the first binding region, and the other first leads cross over the second bending region to the second binding region; some third leads cross over the first bending region to the first binding region, and the other third leads cross over the second bending region to the second binding region; and the second leads cross over the first bending region to the first binding region, and the fourth leads cross over the second bending region to the second binding region.

In some implementations, in the touch display panel provided by the embodiment of the present disclosure, the touch display panel further includes a plurality of first bridging lines in the first bending region and sequentially arranged along the extending direction of the first touch electrode, and a plurality of second bridging lines in the second bending region and sequentially arranged along the extending direction of the first touch electrode; and the number of the second bridging lines electrically connected to each touch lead extending to the second binding region is less than the number of the first bridging lines electrically connected to each touch lead extending to the first binding region.

In some implementations, in the touch display panel provided by the embodiment of the present disclosure, each of some first leads is electrically connected to corresponding at least three first bridging lines, each of some third leads is electrically connected to corresponding at least three first bridging lines, and each of the second leads is electrically connected to corresponding at least three first bridging lines; and each of the other first leads is electrically connected to corresponding at least two second bridging lines, each of the other third leads is electrically connected to corresponding at least two second bridging lines, and each of the fourth leads is electrically connected to corresponding at least two second bridging lines.

In some implementations, in the touch display panel provided by the embodiment of the present disclosure, each first touch electrode has a one-piece structure, each second touch electrode includes a plurality of touch sub-electrodes spaced apart from each other by the plurality of first touch electrodes and a plurality of connecting portions, the touch display panel further includes a first insulating layer between the plurality of touch sub-electrodes and the plurality of connecting portions, the plurality of connecting portions are close to the base substrate, and every two adjacent touch sub-electrodes are electrically connected to the corresponding connecting portion through vias extending through the first insulating layer; the touch display panel includes a first source-drain metal layer, a second insulating layer and a second source-drain metal layer sequentially stacked between the base substrate and the plurality of connecting portions, wherein the first source-drain metal layer is close to the base substrate; a portion of each of the plurality of touch leads corresponding to regions other than the first bending region and the second bending region includes a first metal line and a second metal line electrically connected to each other, the first metal line is in the same layer as the plurality of connecting portions, and the second metal line is in the same layer as the plurality of first touch electrodes; and a portion of each of the plurality of touch leads corresponding to the first bending region and the second bending region is a third metal line in the second source-drain metal layer, the first metal line and the third metal line are electrically connected to each other through a via extending through the second insulating layer between the second source-drain metal layer and the plurality of connecting portions; or the second metal line and the third metal line are electrically connected to each other through a via extending through a third insulating layer between the second source-drain metal layer and the plurality of first touch electrodes.

In some implementations, in the touch display panel provided by the embodiment of the present disclosure, the plurality of touch electrodes include a plurality of first touch electrodes and a plurality of second touch electrodes crossing each other in a horizontal direction and a vertical direction, and the first binding region and the second binding region are respectively located at two ends of the second touch electrodes in an extending direction of the second touch electrodes; the peripheral region further includes a third binding region and a fourth binding region, wherein the third binding region and the fourth binding region are respectively located at two ends of the first touch electrodes in an extending direction of the first touch electrodes, and the peripheral region further includes: a third bending region between the third binding region and the touch display region, and a fourth bending region between the fourth binding region and the touch display region; the plurality of touch leads include first leads and second leads, each of the first leads is electrically connected to a first end of a corresponding one of the plurality of first touch electrodes, and the first leads extend from the touch display region through the third bending region adjacent to the first leads to the third binding region; and each of the second leads is electrically connected to a first end of a corresponding one of the plurality of second touch electrodes, and the second leads extend from the touch display region through the first bending region adjacent to the second leads to the first binding region.

In some implementations, in the touch display panel provided by the embodiment of the present disclosure, the plurality of touch leads further includes third leads and fourth leads, each of the third leads is electrically connected to a second end of a corresponding one of the plurality of first touch electrodes, and the third leads extend from the touch display region through the fourth bending region adjacent to the third leads to the fourth binding region; and each of the fourth leads is electrically connected to a second end of a corresponding one of the plurality of second touch electrodes, and the fourth leads extend from the touch display region through the second bending region adjacent to the fourth leads to two opposite ends of the second binding region.

In some implementations, in the touch display panel provided by the embodiment of the present disclosure, the first leads cross over the third bending region to the third binding region, the second leads cross over the first bending region to the first binding region, the third leads cross over the fourth bending region to the fourth binding region, and the fourth leads cross over the second bending region to the second binding region.

In some implementations, in the touch display panel provided by the embodiment of the present disclosure, the touch display panel further includes a plurality of first bridging lines in the first bending region and sequentially arranged along the extending direction of the first touch electrode, a plurality of second bridging lines in the second bending region and sequentially arranged along the extending direction of the first touch electrode, a plurality of third bridging lines in the third bending region and sequentially arranged along the extending direction of the second touch electrode, and a plurality of fourth bridging lines in the fourth bending region and sequentially arranged along the extending direction of the second touch electrode; and each first lead is electrically connected to corresponding at least two third bridging lines, each second lead is electrically connected to corresponding at least two first bridging lines, each third lead is electrically connected to corresponding at least two fourth bridging lines, and each fourth lead is electrically connected to corresponding at least two second bridging lines.

In some implementations, in the touch display panel provided by the embodiment of the present disclosure, each first touch electrode has a one-piece structure, each second touch electrode includes a plurality of touch sub-electrodes spaced apart from each other by the plurality of first touch electrodes and a plurality of connecting portions, the touch display panel further includes a first insulating layer between the plurality of touch sub-electrodes and the plurality of connecting portions, the plurality of connecting portions are close to the base substrate, and every two adjacent touch sub-electrodes are electrically connected to the corresponding connecting portion through vias extending through the first insulating layer; the touch display panel includes a first source-drain metal layer, a second insulating layer and a second source-drain metal layer sequentially stacked between the base substrate and the plurality of connecting portions, wherein the first source-drain metal layer is close to the base substrate; a portion of each of the plurality of touch leads corresponding to regions other than the first bending region, the second bending region, the third bending region, and the fourth bending region includes a first metal line and a second metal line electrically connected to each other, the first metal line is in the same layer as the plurality of connecting portions, and the second metal line is in the same layer as the plurality of first touch electrodes; and a portion of each of the plurality of touch leads corresponding to the first bending region, the second bending region, the third bending region, and the fourth bending region is a third metal line in the second source-drain metal layer, the first metal line and the third metal line are electrically connected to each other through a via extending through the second insulating layer between the second source-drain metal layer and the plurality of connecting portions; or the second metal line and the third metal line are electrically connected to each other through a via extending through a third insulating layer between the second source-drain metal layer and the plurality of first touch electrodes.

Correspondingly, the embodiment of the present disclosure further provides a touch display apparatus, which includes the touch display panel provided by the embodiments of the present disclosure and at least two flexible circuit boards on the back of the touch display panel, wherein each binding region of the touch display panel is provided with a plurality of first pads therein, and the touch leads are electrically connected to the corresponding flexible circuit boards through the corresponding first pads.

In some implementations, in the touch display apparatus provided by the embodiment of the present disclosure, the first binding region includes the first binding sub-region and the second binding sub-region which are independently arranged, and the second binding region includes the fifth binding sub-region, the sixth binding sub-region, the seventh binding sub-region and the eighth binding sub-region which are sequentially arranged along the extending direction of the first touch electrode and are independently arranged; the at least two flexible circuit boards include a first flexible circuit board, a second flexible circuit board, a third flexible circuit board, a fourth flexible circuit board, a fifth flexible circuit board and a sixth flexible circuit board, the touch display apparatus further includes a printed circuit board on the back of the touch display panel, and the printed circuit board is close to the second binding region and extends along the extending direction of the first touch electrode; terminals at one end of the first flexible circuit board are bonded to the first pads in the first binding sub-region, terminals at one end of the second flexible circuit board are bonded to the first pads in the second binding sub-region, and terminals at the other end of the first flexible circuit board and terminals at the other end of the second flexible circuit board are electrically connected to a portion of the printed circuit board close to the eighth binding sub-region; terminals at one end of the third flexible circuit board are bonded to the first pads in the fifth binding sub-region, terminals at one end of the fourth flexible circuit board are bonded to the first pads in the sixth binding sub-region, terminals at one end of the fifth flexible circuit board are bonded to the first pads in the seventh binding sub-region, and terminals at one end of the sixth flexible circuit board are bonded to the first pads in the eighth binding sub-region; and terminals at the other end of the third flexible circuit board are bonded to the printed circuit board, terminals at the other end of the fourth flexible circuit board are bonded to the printed circuit board, terminals at the other end of the fifth flexible circuit board are bonded to the printed circuit board, and terminals at the other end of the sixth flexible circuit board are bonded to the printed circuit board.

In some implementations, in the touch display apparatus provided by the embodiment of the present disclosure, the printed circuit board includes a first source driver chip, a second source driver chip, a third source driver chip and a fourth source driver chip, the first source driver chip is in a central region on a side of the third flexible circuit board away from the first flexible circuit board, the second source driver chip is in a central region on a side of the fourth flexible circuit board away from the first flexible circuit board, the third source driver chip is in a central region on a side of the fifth flexible circuit board away from the first flexible circuit board, and the fourth source driver chip is in a central region on a side of the sixth flexible circuit board away from the first flexible circuit board; and the printed circuit board further includes a touch driver chip at a corner of the printed circuit board, the touch driver chip is close to the third flexible circuit board, and touch signals are transmitted to the first flexible circuit board, the second flexible circuit board, the third flexible circuit board, the fourth flexible circuit board, the fifth flexible circuit board and the sixth flexible circuit board through traces on the printed circuit board by the touch driver chip.

In some implementations, the touch display apparatus provided by the embodiment of the present disclosure further includes an active stylus.

Correspondingly, the embodiment of the present disclosure further provides a touch substrate, including a touch region and a non-touch region surrounding the touch region, wherein the non-touch region includes: a first binding region and a second binding region on opposite sides of the touch region, a first bending region between the first binding region and the touch region, and a second bending region between the second binding region and the touch region; the touch substrate further includes: a base substrate; a touch electrode layer on the base substrate and in the touch region, wherein the touch electrode layer includes a plurality of touch electrodes in the same layer and insulated from each other; and a plurality of touch leads on the base substrate, wherein each touch lead is electrically connected to a corresponding one of the plurality of touch electrodes, some touch leads extend from the touch region through the first bending region to the first binding region, and the other touch leads extend from the touch region through the second bending region to the second binding region.

In some implementations, in the touch substrate provided by the embodiment of the present disclosure, the plurality of touch electrodes include a plurality of first touch electrodes and a plurality of second touch electrodes crossing each other in a horizontal direction and a vertical direction, the plurality of touch leads include first leads and second leads, and the first binding region and the second binding region are respectively located at two ends of the plurality of second touch electrodes in an extending direction of the plurality of second touch electrodes; each of the first leads is electrically connected to a first end of a corresponding one of the plurality of first touch electrodes, some first leads extend from the touch region through the first bending region to the first binding region, and the other first leads extend from the touch region through the second bending region to the second binding region; and each of the second leads is electrically connected to a first end of a corresponding one of the plurality of second touch electrodes, and the second leads extend from the touch region through the first bending region adjacent to the second leads to the first binding region.

In some implementations, in the touch substrate provided by the embodiment of the present disclosure, the plurality of touch leads further includes third leads and fourth leads, each of the third leads is electrically connected to a second end of a corresponding one of the plurality of first touch electrodes, some third leads extend from the touch region through the first bending region to the first binding region, and the other third leads extend from the touch region through the second bending region to the second binding region; and each of the fourth leads is electrically connected to a second end of a corresponding one of the plurality of second touch electrodes, and the fourth leads extend from the touch region through the second bending region adjacent to the fourth leads to the second binding region.

In some implementations, in the touch substrate provided by the embodiment of the present disclosure, the first binding region includes a first binding sub-region and a second binding sub-region that are independently provided, the first binding sub-region is close to the first end of the first touch electrode, and the second binding sub-region is close to the second end of the first touch electrode; some first leads extend from the touch region through the first bending region to a side of the first binding sub-region close to the first end of the first touch electrode, and some third leads extend from the touch region through the first bending region to a side of the second binding sub-region close to the second end of the first touch electrode; and some second leads extend from the touch region through the first bending region to a side of the first binding sub-region away from the first end of the first touch electrode, and the other second leads extend from the touch region through the first bending region to a side of the second binding sub-region away from the second end of the first touch electrode.

In some implementations, in the touch substrate provided by the embodiment of the present disclosure, the second binding region includes a fifth binding sub-region, a sixth binding sub-region, a seventh binding sub-region, and an eighth binding sub-region, which are sequentially arranged and independently provided along the extending direction of the first touch electrode; the other first leads extend from the touch region through the second bending region to a side of the fifth binding sub-region close to the first end of the first touch electrode, and the other third leads extend from the touch region through the second bending region to a side of the eighth binding sub-region close to the second end of the first touch electrode; and the fourth leads are sequentially divided into a first group of fourth leads, a second group of fourth leads, a third group of fourth leads and a fourth group of fourth leads along the extending direction of the first touch electrode, the first group of fourth leads extend from the touch region through the second bending region to a side of the fifth binding sub-region away from the first end of the first touch electrode, the second group of fourth leads extend from the touch region through the second bending region to a side of the sixth binding sub-region close to the first end of the first touch electrode, the third group of fourth leads extend from the touch region through the second bending region to a side of the seventh binding sub-region close to the second end of the first touch electrode, and the fourth group of fourth leads extend from the touch region through the second bending region to a side of the eighth binding sub-region away from the second end of the first touch electrode.

DETAIL DESCRIPTION OF THE EMBODIMENTS

Figure 1:
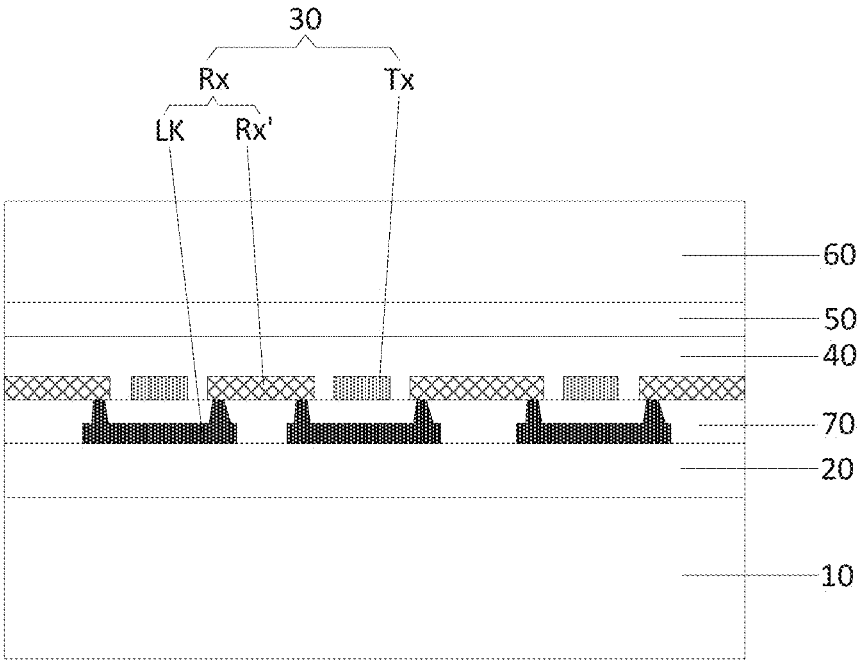
FIG. 1 is a schematic diagram of a structure of a touch display screen according to embodiments of the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few, not all of, embodiments of the present disclosure. The embodiments and features of the embodiments in the present disclosure may be combined with each other without conflict. All other embodiments, which can be derived by a person skilled in the art from the embodiments of the present disclosure without any creative effort, are within the protection scope of the present disclosure.

Unless defined otherwise, technical or scientific terms used herein shall have the ordinary meaning as understood by one of ordinary skill in the art to which the present disclosure belongs. The term “comprising”, “including”, or the like means that the element or item preceding the term contains the element or item listed after the term and its equivalent, but does not exclude other elements or items. The term “connected”, “coupled”, or the like is not limited to physical or mechanical connections, but may include electrical connections, whether direct or indirect connections. The terms “inner”, “outer”, “upper”, “lower”, and the like are used only for indicating relative positional relationships, and when the absolute position of an object being described is changed, the relative positional relationships may also be changed accordingly.

It should be noted that the sizes and shapes of various elements shown in the drawings are not necessarily drawn to scale and are merely schematic representations of the present disclosure. Like or similar elements or elements having like or similar functions are denoted by like or similar reference signs throughout the various figures.

A capacitive touch screen on the market today has a touch function with a stylus, in addition to the common touch function with a finger. The stylus may include a passive stylus or an active stylus. The active stylus has a small and exquisite pen point and has the functions such as pen pressure, suspension touch, button and the like, and thus has a wider application scene and prospect than the passive stylus. With the popularization of the active stylus, more and more touch screens, for example an electronic product with a touch screen, such as a mobile phone, a notebook computer, or a tablet computer, or the like, are equipped with the active stylus, which has higher requirements on various performances of the active stylus. Thus, the characteristics of the active stylus, including accuracy, a signal-to-noise ratio (SNR), and a hover height, need to be improved.

With the demand of a terminal customer for the product to be light, thin, folded and rollable, the FMLOC touch technology is emerged. As shown in FIG. 1, a touch screen includes a display panel 10, an encapsulation layer 20, a touch structure 30, a polarizer 40, an optical adhesive 50 and a cover plate 60, which are sequentially stacked. That is, the touch structure 30 is directly formed on the encapsulation layer 20 on the display panel 10, and may adopt a metal mesh structure. That is, first touch electrodes Tx and second touch electrodes Rx are located in the same layer, and are cooperated with a touch IC to realize the touch function.

Figure 2:
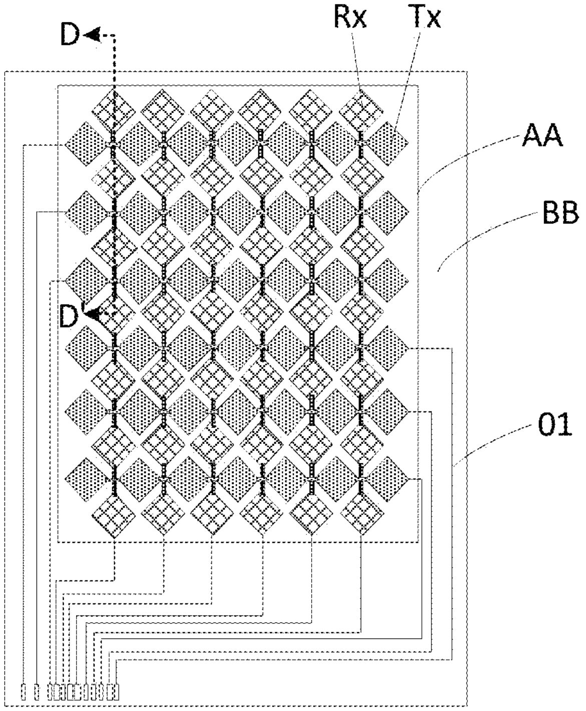
FIG. 2 is a schematic diagram illustrating how to route touch leads of a touch structure in the related art.

FIG. 2 is a schematic plan view of the touch structure 30 in FIG. 1. The touch structure 30 includes first touch electrodes Tx and second touch electrodes Rx insulated from each other and crossing each other, and touch leads 01, and the touch leads 01 are electrically connected to the corresponding first touch electrodes Tx and the corresponding second touch electrodes Rx, and extend from a touch region AA to a peripheral region BB. The touch leads 01 with the FMLOC technology are all led out to a binding region on a lower side of a base substrate, and the touch leads 01 electrically connected to different touch electrodes have different lengths. For the longer touch lead 01, a signal quantity of an active stylus is seriously attenuated due to the larger RC loading on the lead, and the requirement of mainstream customers on the performance of the active stylus is difficult to meet.

In view of this, in order to reduce the attenuation of the signal quantity of the active stylus and improve the performance index of the active stylus, embodiments of the present disclosure provide a touch display panel, as shown in FIGS. 3 to 7, including a touch display region AA and a peripheral region BB surrounding the touch display region AA, and the peripheral region BB includes: a first binding region B1 and a second binding region B2 located on two opposite sides of the touch display region AA, a first bending region BD1 located between the first binding region B1 and the touch display region AA, and a second bending region BD2 located between the second binding region B2 and the touch display region AA.

The touch display panel further includes:

A base substrate 1;

A touch electrode layer arranged on the base substrate 1 and in the touch display region AA, wherein the touch electrode layer includes a plurality of touch electrodes (Tx and Rx) arranged in the same layer and insulated from each other;

A plurality of touch leads 2 provided on the base substrate 1, wherein each touch lead 2 is electrically connected to a corresponding one of the touch electrodes (Tx or Rx), some touch leads 2 extend from the touch display region AA through the first bending region BD1 to the first binding region B1, and are bent to the back of the touch display panel in the first bending region BD1, and the other touch leads 2 extend from the touch display region AA through the second bending region BD2 to the second binding region B2, and are bent to the back of the touch display panel in the second bending region BD2. In FIGS. 3 to 7, in the embodiment of the present disclosure, the structure of the touch display panel is described by taking the touch leads 2 being not bent as an example.

According to the touch display panel provided by the embodiment of the present disclosure, some touch leads are led out to the first binding region, and the other touch leads are led out to the second binding region, and the first binding region and the second binding region are located on two opposite sides of the touch display region. That is, the touch leads in the embodiments of the present disclosure are routed from the touch electrodes to the binding regions on two opposite sides of the touch display panel, so that the RC loading on the touch leads can be reduced, the attenuation of the signal quantity of the active stylus can be reduced, a signal-to-noise ratio of the active stylus can be improved, and the performance index of the active stylus can be realized.

In some implementations, in the touch display panel provided in the embodiments of the present disclosure, as shown in FIG. 3 to FIG. 6, the plurality of touch electrodes include a plurality of first touch electrodes Tx and a plurality of second touch electrodes Rx crossing each other in a horizontal direction and a vertical direction, the plurality of touch leads 2 include first leads (21 and 21') and second leads (22 and 22'), and the first binding region B1 and the second binding region B2 are respectively located at two ends of the second touch electrodes Rx in an extending direction of the second touch electrodes Rx.

Each of the first leads (21 and 21') is electrically connected to a first end of a corresponding one of the first touch electrodes Tx, some first leads 21 extend from the touch display region AA through the first bending region BD1 to the first binding region B1, and the other first leads 21' extend from the touch display region AA through the second bending region BD2 to the second binding region B2. Therefore, the first leads (21 and 21') are led out from two sides, and the RC loading on the first leads (21 and 21') can be reduced, so that the attenuation of the signal quantity of the active stylus can be reduced, the signal-to-noise ratio of the active stylus can be improved, and the performance index of the active stylus can be realized.

Each of the second leads (22 and 22') is electrically connected to a first end of a corresponding one of the second touch electrodes Rx, and the second leads (22 and 22') extend from the touch display region AA through the first bending region BD1 adjacent to the second leads (22 and 22') to the first binding region B1.

In some implementations, in the touch display panel provided in the embodiments of the present disclosure, as shown in FIGS. 3 to 6, the plurality of touch leads 2 further includes third leads (23 and 23') and fourth leads (24 and 24'), each of the third leads (23 and 23') is electrically connected to a second end of a corresponding one of the first touch electrodes Tx, some third leads 23 extend from the touch display region AA through the first bending region BD1 to the first binding region B1, and the other third leads 23' extend from the touch display region AA through the second bending region BD2 to the second binding region B2. Therefore, each first touch electrode Tx adopts a double-end lead (the two leads at the two ends of the first touch electrode Tx), and when a touch signal is loaded, the touch signal may be loaded from the first end and the second end of the first touch electrode Tx at the same time, so that the uniformity of the touch signal can be improved, and the touch performance can be improved. In addition, the third leads (23 and 23') are led out from two sides, and the RC loading on the third leads (23 and 23') can be reduced, so that the attenuation of the signal quantity of the active stylus can be reduced, the signal-to-noise ratio of the active stylus can be improved, and the performance index of the active stylus can be realized.

Each of the fourth leads (24 and 24') is electrically connected to a second end of a corresponding one of the second touch electrodes Rx, and the fourth leads (24 and 24') extend from the touch display region AA through the second bending region BD2 adjacent to the fourth leads (24 and 24') to the second binding region B2. Therefore, each second touch electrode Rx adopts a double-end lead (the two leads at the two ends of the second touch electrode Rx), and when a touch signal is loaded, the touch signal may be loaded from the first end and the second end of the second touch electrode Rx at the same time, so that the uniformity of the touch signal can be improved, and the touch performance can be improved. In addition, the second leads (22 and 22') and the fourth leads (24 and 24') electrically connected to the second touch electrodes Rx are respectively led out to the binding regions adjacent to the second leads (22 and 22') and the fourth leads (24 and 24'), so that the RC loading on the second leads (22 and 22') and the fourth leads (24 and 24') can be reduced, the attenuation of the signal quantity of the active stylus can be further reduced, the signal-to-noise ratio of the active stylus can be improved, and the performance index of the active stylus can be realized.

Figure 3:
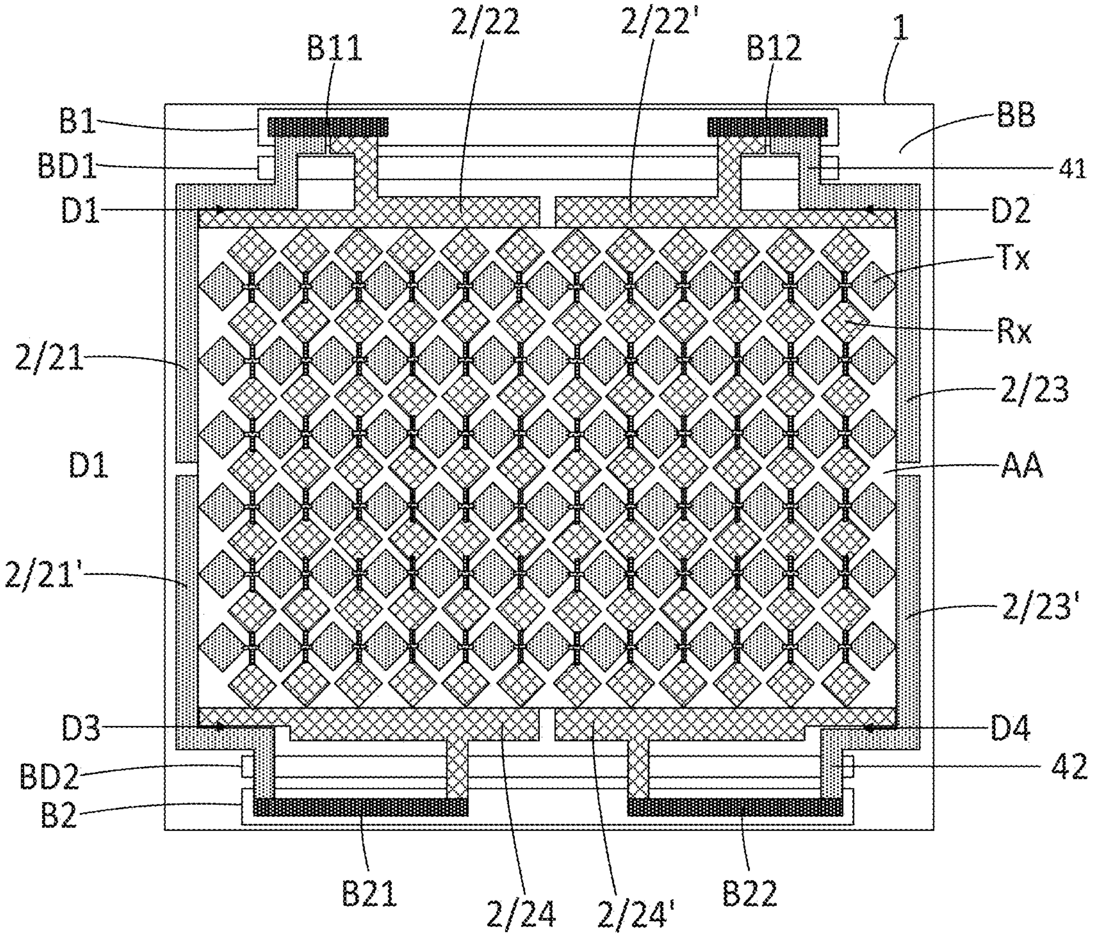
FIG. 3 is a schematic diagram of a structure of a touch display panel according to embodiments of the present disclosure.
Figure 4:
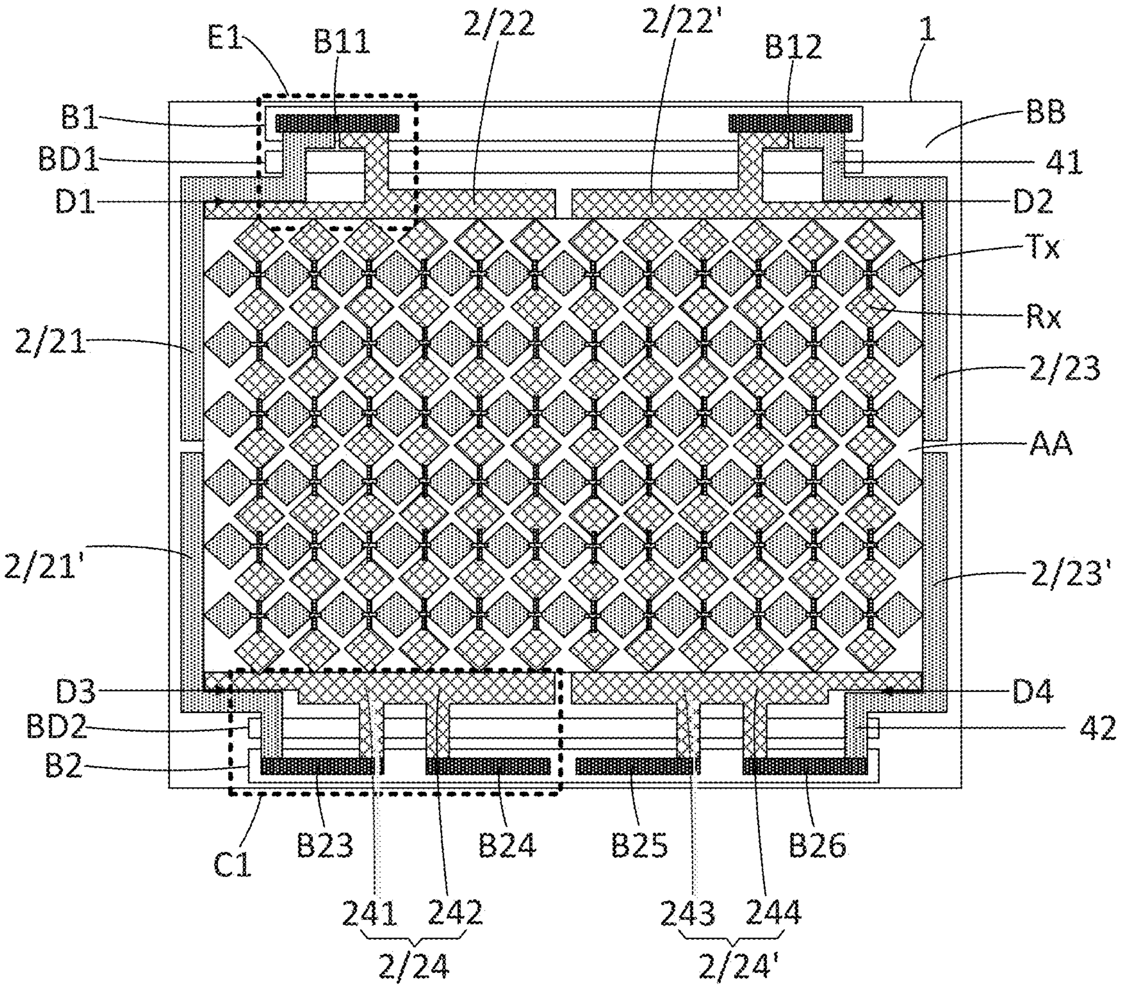
FIG. 4 is a schematic diagram of a structure of another touch display panel according to embodiments of the present disclosure.

In some implementations, as shown in FIGS. 3 and 4, in the touch display panel provided in the embodiments of the present disclosure, the first binding region B1 includes a first binding sub-region B11 and a second binding sub-region B12 that are provided to be separated from each other, the first binding sub-region B11 is close to the first end of the first touch electrode Tx, and the second binding sub-region B12 is close to the second end of the first touch electrode Tx.

Some first leads 21 extend from the touch display region AA through the first bending region BD1 to a side of the first binding sub-region B11 close to the first end of the first touch electrode Tx, and some third leads 23 extend from the touch display region AA through the first bending region BD1 to a side of the second binding sub-region B12 close to the second end of the first touch electrode Tx.

Some second leads 22 extend from the touch display region AA through the first bending region BD1 to a side of the first binding sub-region B12 away from the first end of the first touch electrode Tx, and the other second leads 22' extend from the touch display region AA through the first bending region BD1 to a side of the second binding sub-region B12 away from the second end of the first touch electrode Tx. In this way, by leading out some first leads 21 and some second leads 22 to the first binding sub-region B11 adjacent to the first leads 21 and the second leads 22, and leading out some third leads 23 and the other second leads 22' to the second binding sub-region B12 adjacent to the third leads 23 and the other second leads 22', the RC loading on the first leads 21, the second leads (22 and 22') and the third leads 23 can be further reduced, thereby further reducing the attenuation of the signal quantity of the active stylus, improving the signal-to-noise ratio of the active stylus, and realizing the performance index of the active stylus.

In some implementations, as shown in FIG. 3, in the touch display panel provided in the embodiments of the present disclosure, the second binding region B2 includes a third binding sub-region B21 and a fourth binding sub-region B22 that are provided to be separated from each other, the third binding sub-region B21 is close to the first end of the first touch electrode Tx, and the fourth binding sub-region B22 is close to the second end of the first touch electrode Tx.

The other first leads 21' extend from the touch display region AA through the second bending region BD2 to a side of the third binding sub-region B21 close to the first end of the first touch electrode Tx, and the other third leads 23' extend from the touch display region AA through the second bending region BD2 to a side of the fourth binding sub-region B22 close to the second end of the first touch electrode Tx.

Some fourth leads 24 extend from the touch display region AA through the second bending region BD2 to a side of the third binding sub-region B21 away from the first end of the first touch electrode Tx, and the other fourth leads 24' extend from the touch display region AA through the second bending region BD2 to a side of the fourth binding sub-region B22 away from the second end of the first touch electrode Tx. In this way, by leading out the other first leads 21' and some fourth leads 24 to the third binding sub-region B21 adjacent to the other first leads 21' and the fourth leads 24, and leading out the other third leads 23' and the other fourth leads 24' to the fourth binding sub-region B22 adjacent to the other third leads 23' and the other fourth leads 24', the RC loading on the first leads 21', the fourth leads (24 and 24'), and the third leads 23' can be further reduced, thereby further reducing the attenuation of the signal quantity of the active stylus, improving the signal-to-noise ratio of the active stylus, and realizing the performance index of the active stylus.

In some implementations, in the touch display panel provided by the embodiments of the present disclosure, as shown in FIG. 4, the second binding region B2 includes a fifth binding sub-region B23, a sixth binding sub-region B24, a seventh binding sub-region B25, and an eighth binding sub-region B26, which are sequentially arranged and provided to be separated from each other along the extending direction of the first touch electrode Tx.

The other first leads 21' extend from the touch display region AA through the second bending region BD2 to a side of the fifth binding sub-region B23 close to the first end of the first touch electrode Tx, and the other third leads 23' extend from the touch display region AA through the second bending region BD2 to a side of the eighth binding sub-region B26 close to the second end of the first touch electrode Tx.

The fourth leads (24 and 24') are sequentially divided into a first group of fourth leads 241, a second group of fourth leads 242, a third group of fourth leads 243 and a fourth group of fourth leads 244 along the extending direction of the first touch electrode Tx, the first group of fourth leads 241 extend from the touch display region AA through the second bending region BD2 to a side of the fifth binding sub-region B23 away from the first end of the first touch electrode Tx, the second group of fourth leads 242 extend from the touch display region AA through the second bending region BD2 to a side of the sixth binding sub-region B24 close to the first end of the first touch electrode Tx, the third group of fourth leads 243 extend from the touch display region AA through the second bending region BD2 to a side of the seventh binding sub-region B25 close to the second end of the first touch electrode Tx, and the fourth group of fourth leads 244 extends from the touch display region AA through the second bending region BD2 to a side of the eighth binding sub-region B26 away from the second end of the first touch electrode Tx. Therefore, the second binding region B2 includes the four binding sub-regions, the fourth leads (24 and 24') are divided into the four groups of leads, and each group of fourth leads is led out to the binding sub-region adjacent to the group of fourth leads, so that the RC loading on the fourth leads (24 and 24') can be further reduced, the attenuation of the signal quantity of the active stylus can be further reduced, the signal-to-noise ratio of the active stylus can be improved, and the performance index of the active stylus can be realized.

Figure 5:
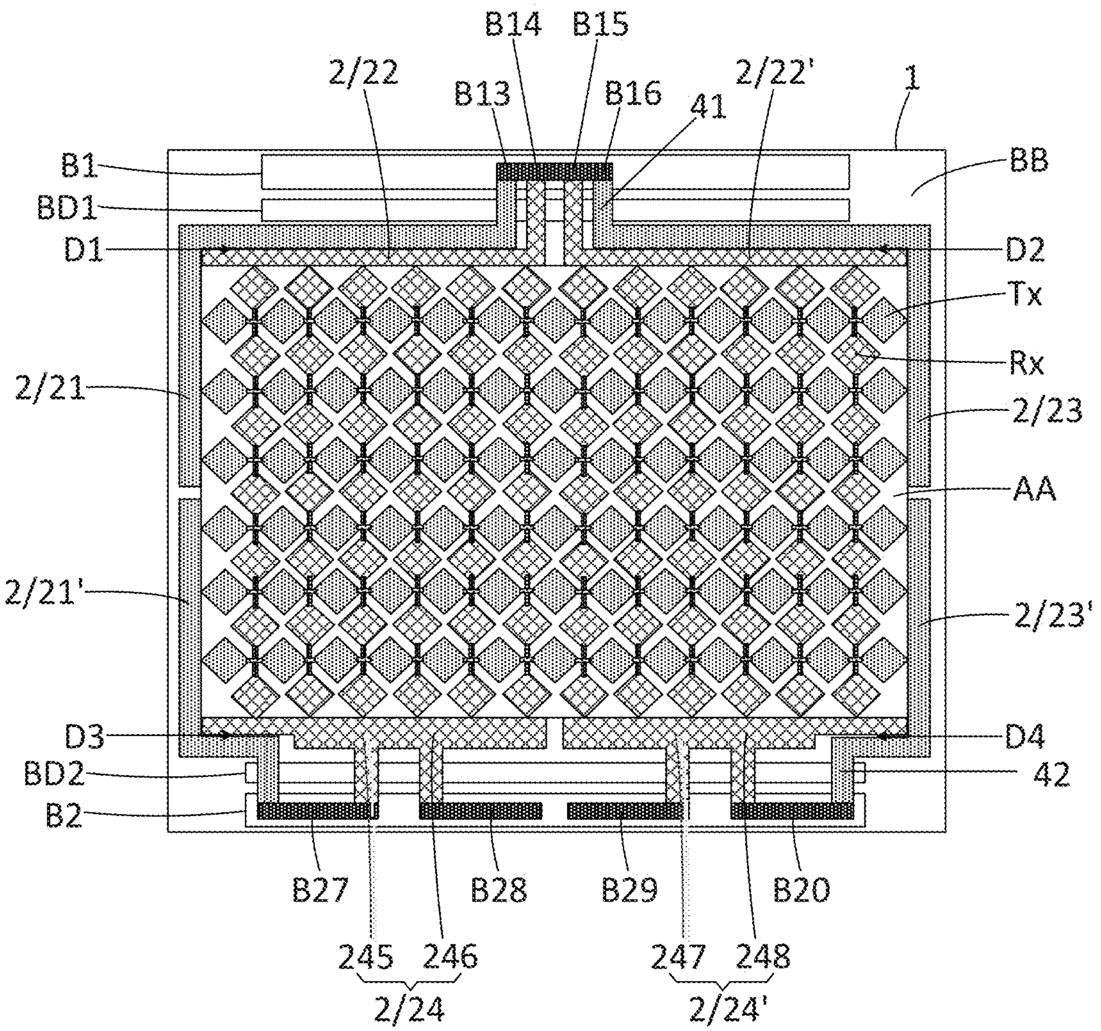
FIG. 5 is a schematic diagram of a structure of another touch display panel according to embodiments of the present disclosure.
Figure 6:
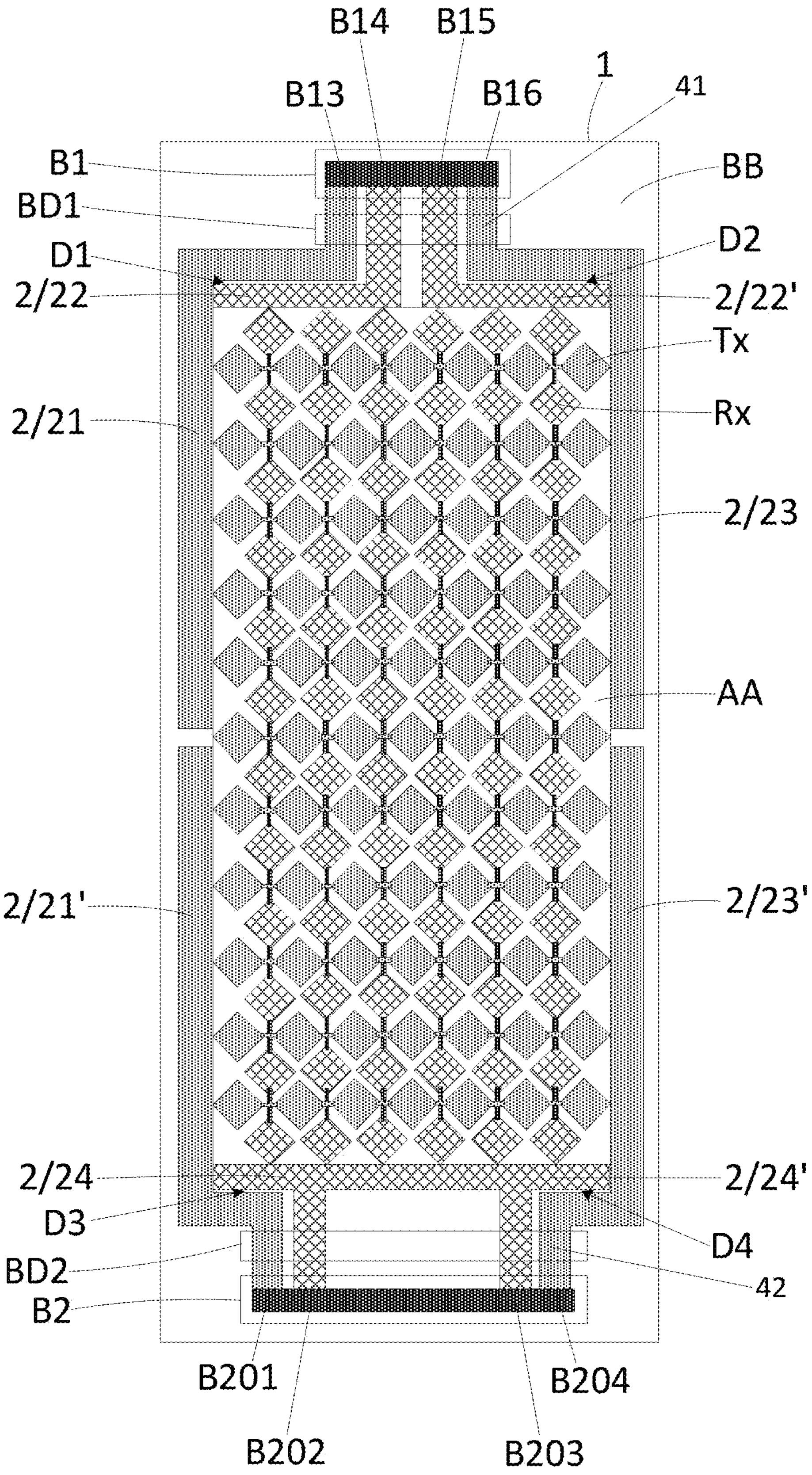
FIG. 6 is a schematic diagram of a structure of another touch display panel according to embodiments of the present disclosure.

In some implementations, as shown in FIGS. 5 and 6, in the touch display panel provided by the embodiments of the present disclosure, the first binding region B1 is located in a central region of the peripheral region BB at the first end of the second touch electrode Rx, and is divided into a first region B13, a second region B14, a third region B15 and a fourth region B16 sequentially arranged along the extending direction of the first touch electrode Tx, and the first region B13 is close to the first end of the first touch electrode Tx.

Some first leads 21 extend from the touch display region AA through the first bending region BD1 to the first region B13, and some third leads 23 extend from the touch display region AA through the first bending region BD1 to the fourth region B16.

Some second leads 22 extend from the touch display region AA through the first bending region BD1 to the second region B14, and the other second leads 22' extend from the touch display region AA through the first bending region BD1 to the third region B15. Therefore, the first binding region B1 is divided into the four regions, and some first leads 21, some third leads 23, some second leads 22 and the other second leads 22' are respectively led out to the regions adjacent to the first leads 21, the third leads 23, the second leads 22 and the other second leads 22', so that the RC loading on the first leads 21, the third leads 23 and the second leads (22 and 22') can be further reduced, the attenuation of the signal quantity of the active stylus can be further reduced, the signal-to-noise ratio of the active stylus can be improved, and the performance index of the active stylus can be realized.

In some implementations, in the touch display panel provided by the embodiments of the present disclosure, as shown in FIG. 5, the second binding region B2 includes a ninth binding sub-region B27, a tenth binding sub-region B28, an eleventh binding sub-region B29, and a twelfth binding sub-region B20 sequentially arranged and provided to be separated from each other along the extending direction of the first touch electrode Tx.

The other first leads 21' extend from the touch display region AA through the second bending region BD2 to a side of the ninth binding sub-region B27 close to the first end of the first touch electrode Tx, and the other third leads 23' extend from the touch display region AA through the second bending region BD2 to a side of the twelfth binding sub-region B20 close to the second end of the first touch electrode Tx.

The fourth leads (24 and 24') are sequentially divided into a fifth group of fourth leads 245, a sixth group of fourth leads 246, a seventh group of fourth leads 247, and an eighth group of fourth leads 248 along the extending direction of the first touch electrode Tx, the fifth group of fourth leads 245 extend from the touch display region AA through the second bending region BD2 to a side of the ninth binding sub-region B27 away from the first end of the first touch electrode Tx, the sixth group of fourth leads 246 extend from the touch display region AA through the second bending region BD2 to a side of the tenth binding sub-region B28 close to the first end of the first touch electrode Tx, the seventh group of fourth leads 247 extend from the touch display region AA through the second bending region BD2 to a side of the eleventh binding sub-region B29 close to the second end of the first touch electrode Tx, and the eighth group of fourth leads 248 extend from the touch display region AA through the second bending region BD2 to a side of the twelfth binding sub-region B20 away from the second end of the first touch electrode Tx. Therefore, the second binding region B2 includes the four binding sub-regions, the fourth leads (24 and 24') are divided into the four groups of leads, and each group of fourth leads are led out to the binding sub-region adjacent to the group of fourth leads, so that the RC loading on the fourth leads (24 and 24') can be further reduced, the attenuation of the signal quantity of the active stylus can be further reduced, the signal-to-noise ratio of the active stylus can be improved, and the performance index of the active stylus can be realized.

In some implementations, in the touch display panel provided by the embodiments of the present disclosure, as shown in FIG. 6, the second binding region B2 is located in a central region of the peripheral region BB at the second end of the second touch electrode Rx, and is divided into a fifth region B201, a sixth region B202, a seventh region B203 and an eighth region B204 sequentially arranged along the extending direction of the first touch electrode Tx, and the fifth region B201 is close to the first end of the first touch electrode Tx.

The other first leads 21' extend from the touch display region AA through the second bending region BD2 to the fifth region B201, and the other third leads 23' extend from the touch display region AA through the second bending region BD2 to the eighth region B204.

Some fourth leads 24 extend from the touch display region AA through the second bending region BD2 to the sixth region B202, and the other fourth leads 24' extend from the touch display region AA through the second bending region BD2 to the seventh region B203. Therefore, the second binding region B2 is divided into the four regions, and the other first leads 21', the other third leads 23', some fourth leads 24 and the other fourth leads 24' are respectively led out to the regions adjacent to the other first leads 21', the other third leads 23', the fourth leads 24 and the other fourth leads 24', so that the RC loading on the first leads 21', the third leads 23' and the fourth leads (24 and 24') can be further reduced, the attenuation of the signal quantity of the active stylus can be further reduced, the signal-to-noise ratio of the active stylus can be improved, and the performance index of the active stylus can be realized.

Figure 8A:
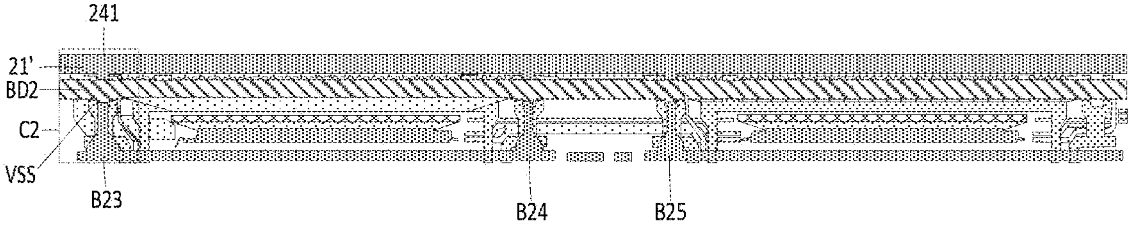
FIG. 8A is an enlarged schematic diagram of a dashed box C1 in FIG. 4.
Figure 8B:
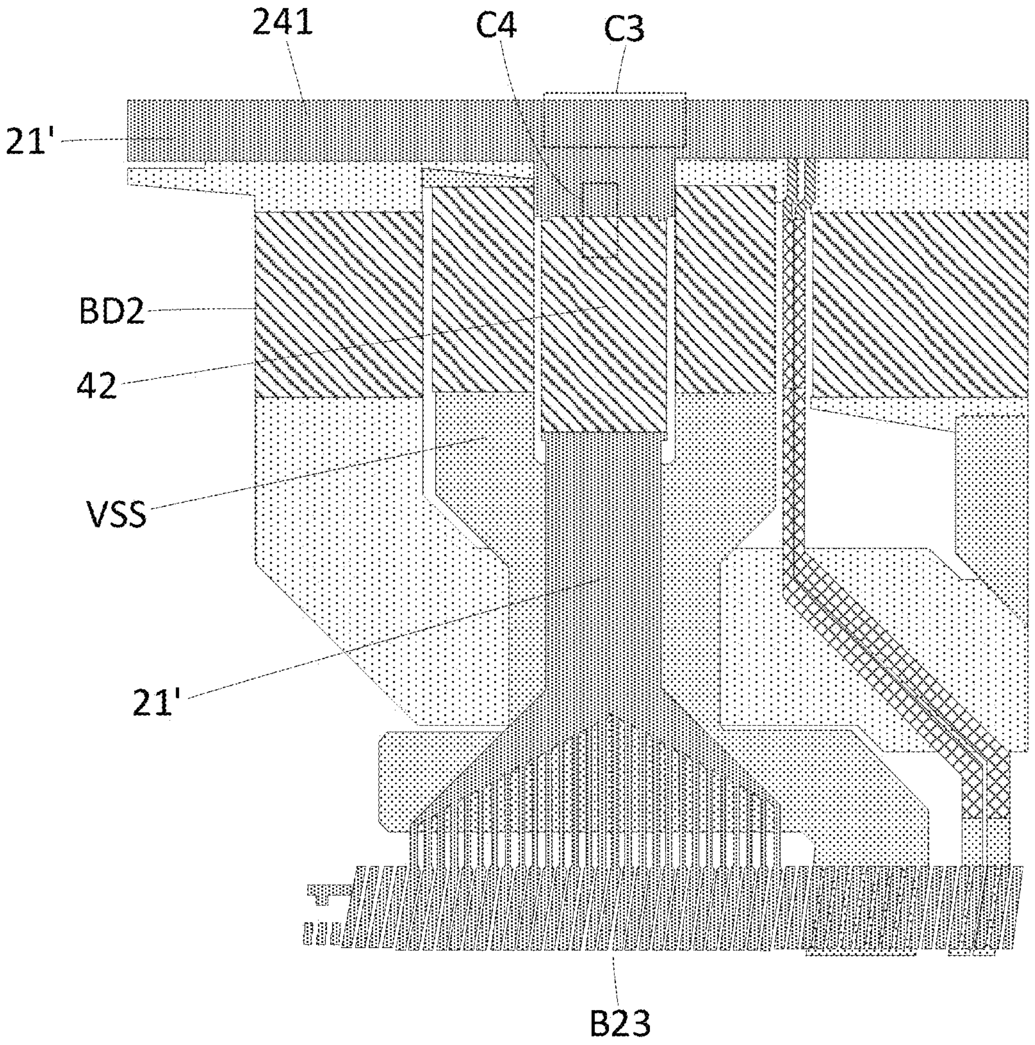
FIG. 8B is an enlarged schematic diagram of a dashed box C2 in FIG. 8A.
Figure 8C:
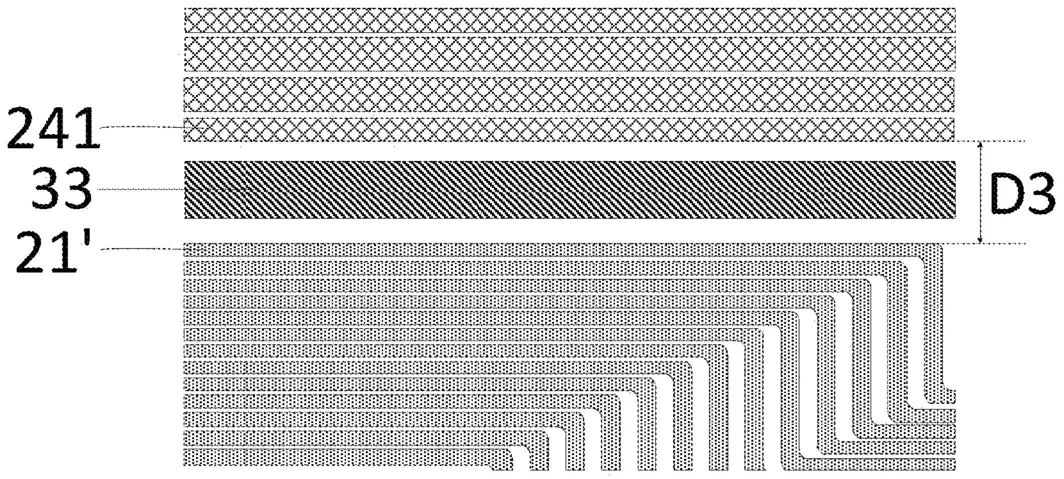
FIG. 8C is an enlarged schematic diagram of a dashed box C3 in FIG. 8B.
Figure 8D:
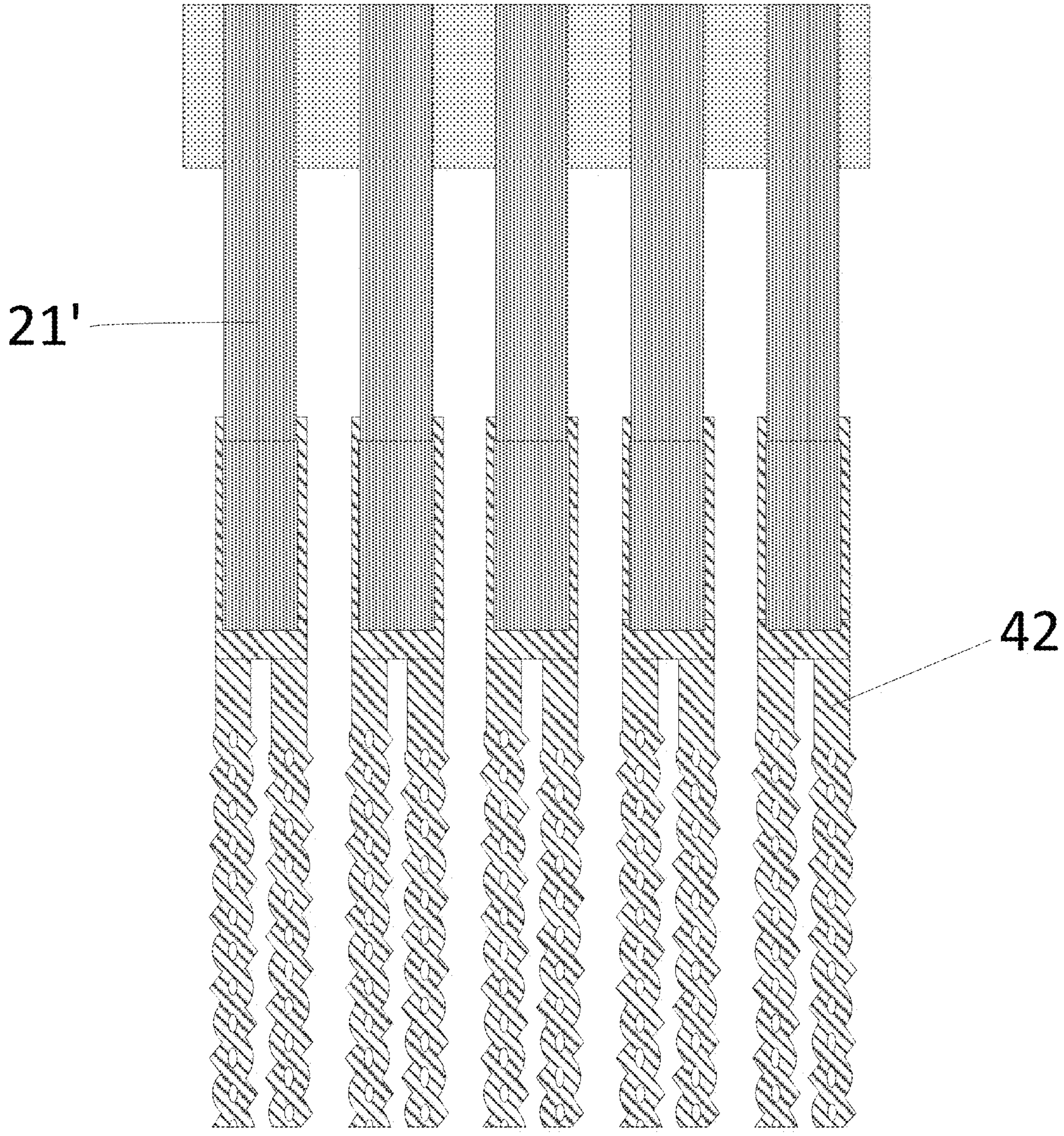
FIG. 8D is an enlarged schematic diagram of a dashed box C4 in FIG. 8B.
Figure 8E:
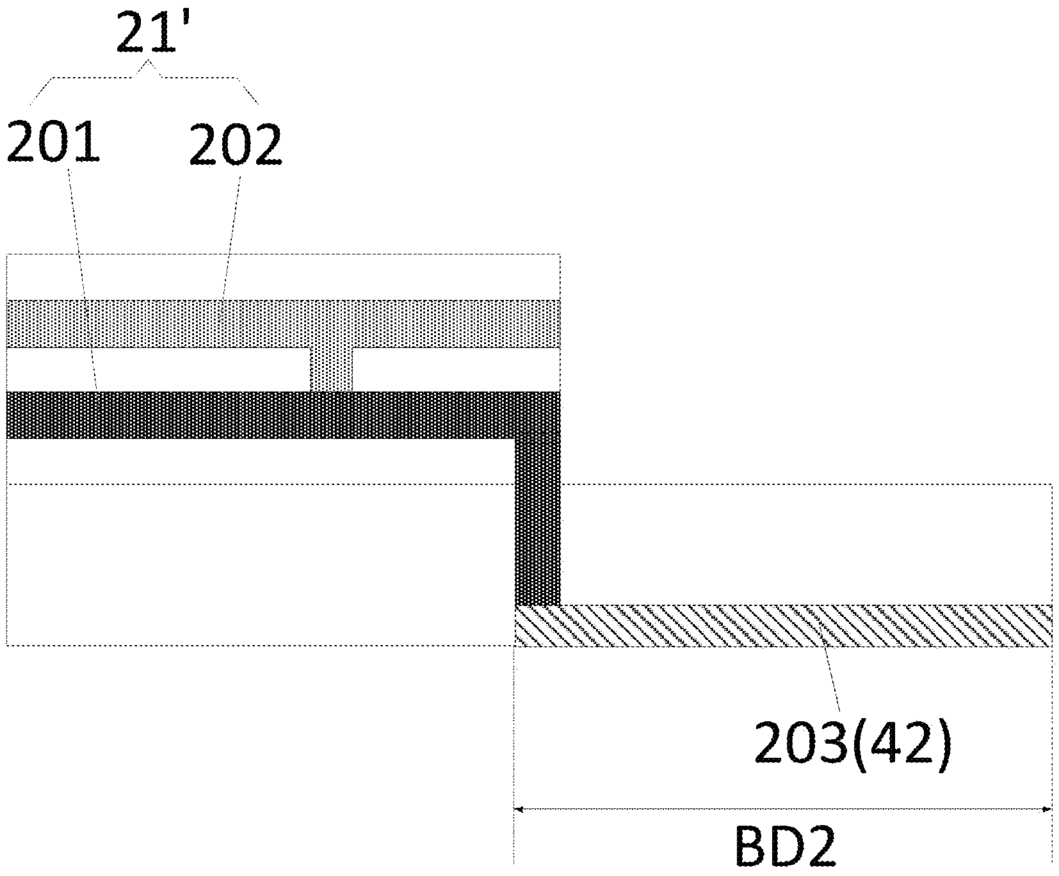
FIG. 8E is a schematic cross-sectional view of a dashed box C4 in FIG. 8B.
Figure 9A:
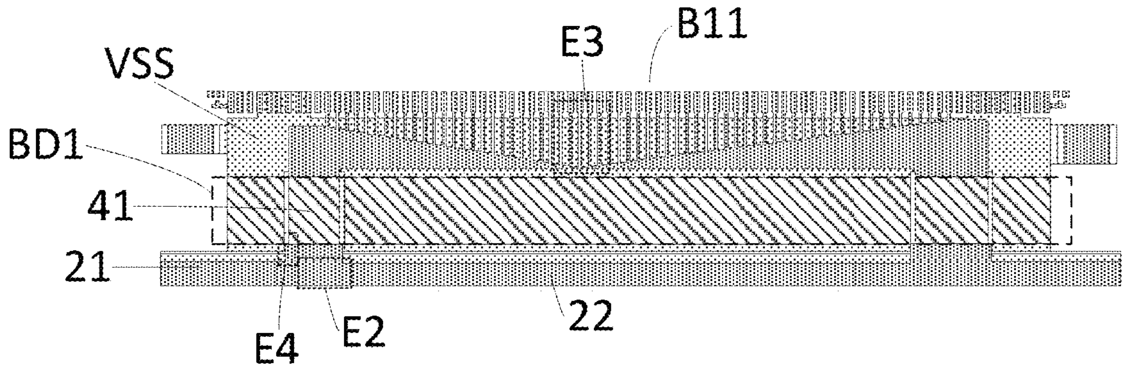
FIG. 9A is an enlarged schematic diagram of a dashed box E1 in FIG. 4.
Figure 9B:
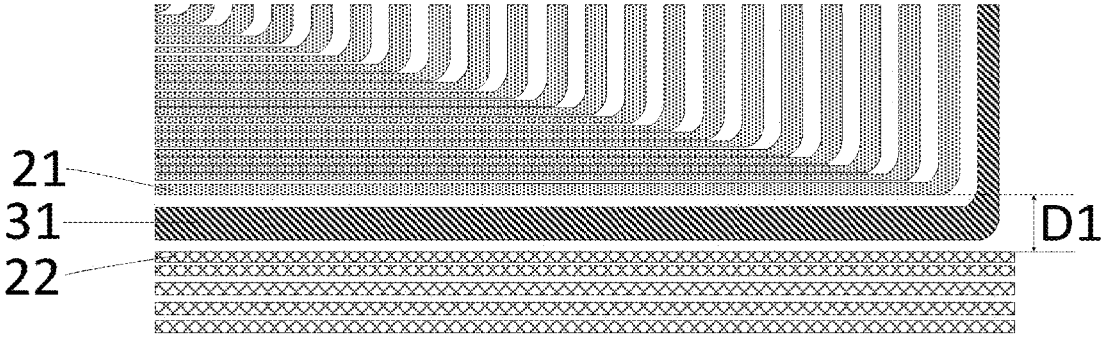
FIG. 9B is an enlarged schematic diagram of a dashed box E2 in FIG. 9A.
Figure 9C:
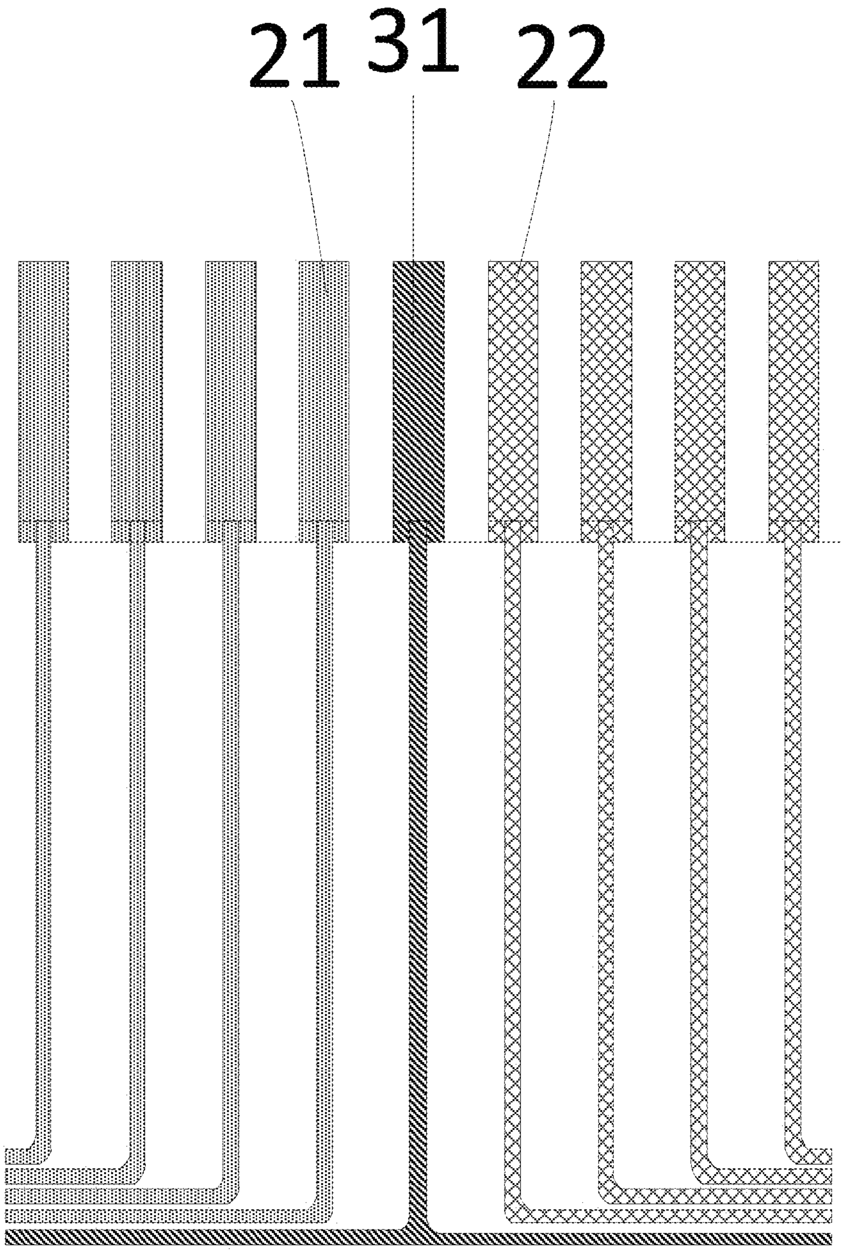
FIG. 9C is an enlarged schematic diagram of a dashed box E3 in FIG. 9A.
Figure 9D:
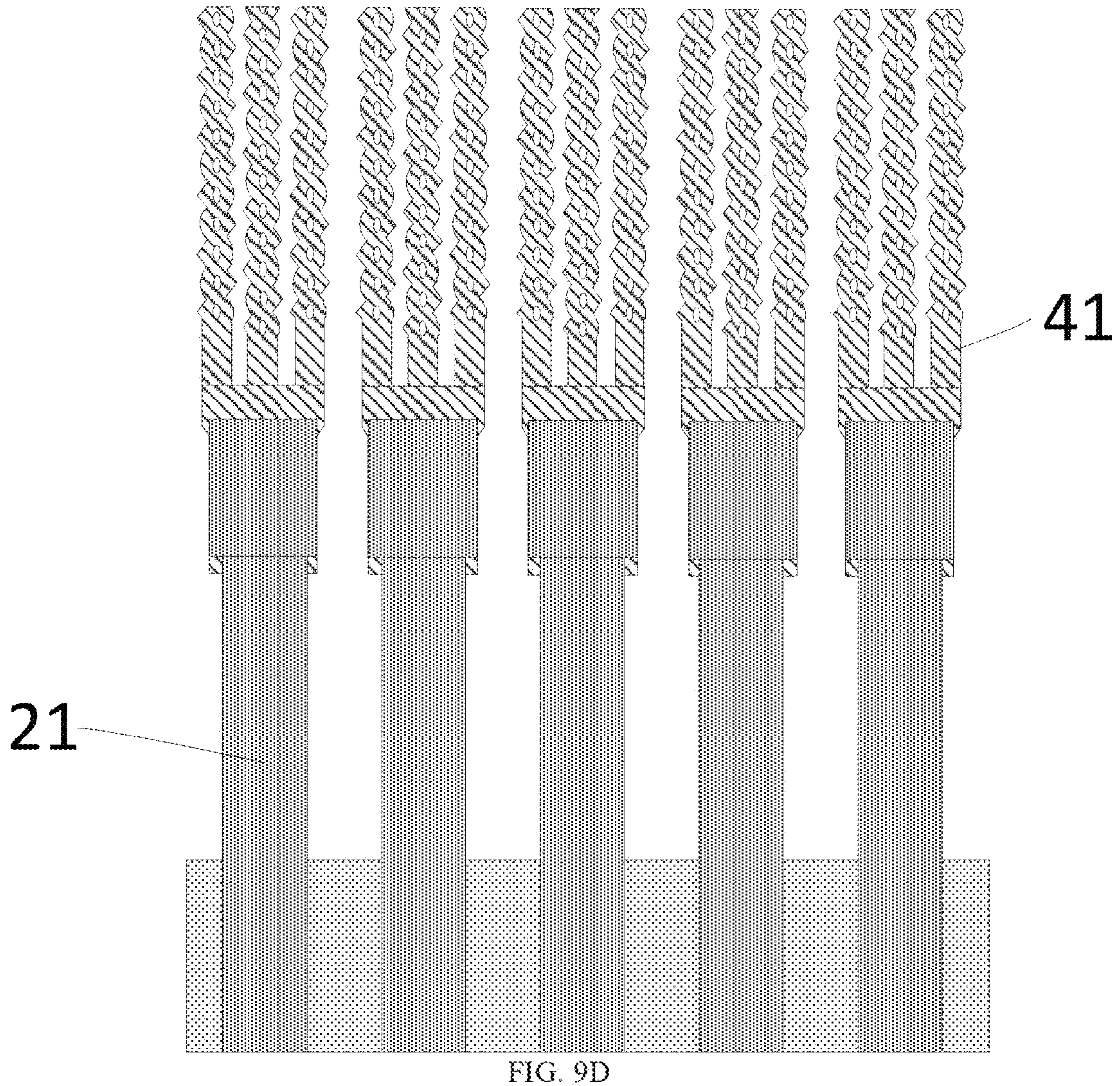
FIG. 9D is an enlarged schematic diagram of a dashed box E4 in FIG. 9A.

In some implementations, FIG. 8A is an enlarged schematic diagram of a dashed box C1 in FIG. 4; FIG. 8B is an enlarged schematic diagram of a dashed box C2 in FIG. 8A; FIG. 8C is an enlarged schematic diagram of a dashed box C3 in FIG. 8B; FIG. 8D is an enlarged schematic diagram of a dashed box C4 in FIG. 8B; FIG. 8E is a schematic cross-sectional view of layers along a direction from the second bending region BD2 to the second binding region B2 in a dashed box C4 in FIG. 8B; FIG. 9A is an enlarged schematic diagram of a dashed box E1 in FIG. 4; FIG. 9B is an enlarged schematic diagram of a dashed box E2 in FIG. 9A; FIG. 9C is an enlarged schematic diagram of a dashed box E3 in FIG. 9A; FIG. 9D is an enlarged schematic diagram of a dashed box E4 in FIG. 9A. In the touch display panel provided by the embodiments of the present disclosure, as shown in FIGS. 3 to 6, 8A to 8D, and 9A to 9D, a gap between the first lead 21 electrically connected to the first touch electrode Tx closest to the first end of the second touch electrode Rx and the second lead 22 electrically connected to the second touch electrode Rx closest to the first end of the first touch electrode Tx is a first gap D1, and a width of the first gap D1 is greater than or equal to 70 μm. Therefore, the signal interference between the first lead 21 and the second lead 22 can be reduced, and the signal stability of the touch display panel can be improved, and the signal stability of the operating environment for the active stylus can be improved, so that the key performances including the SNR (signal-to-noise ratio), the linearity and the like of the active stylus can be improved.

A gap between the third lead 23 electrically connected to the first touch electrode Tx closest to the first end of the second touch electrode Rx and the second lead 22' electrically connected to the second touch electrode Rx closest to the second end of the first touch electrode Tx is a second gap D2, and a width of the second gap D2 is greater than or equal to 70 μm. Therefore, the signal interference between the third lead 23 and the second lead 22' can be reduced, the signal stability of the touch display panel can be improved, and the signal stability of the operating environment for the active stylus can be improved, so that the key performances including the SNR, the linearity and the like of the active stylus can be improved.

A gap between the first lead 21' electrically connected to the first touch electrode Tx closest to the second end of the second touch electrode Rx and the fourth lead 24 electrically connected to the second touch electrode Rx closest to the first end of the first touch electrode Tx is a third gap D3, and a width of the third gap D3 is greater than or equal to 70 μm. Therefore, the signal interference between the first lead 21' and the fourth lead 24 can be reduced, the signal stability of the touch display panel can be improved, and the signal stability of the operating environment for the active stylus can be improved, so that the key performances including the SNR, the linearity and the like of the active stylus can be improved.

A gap between the third lead 23' electrically connected to the first touch electrode Tx closest to the second end of the second touch electrode Rx and the fourth lead 24' electrically connected to the second touch electrode Rx closest to the second end of the first touch electrode Tx is a fourth gap D4, and a width of the fourth gap D4 is greater than or equal to 70 μm. Therefore, the signal interference between the third lead 23' and the fourth lead 24' can be reduced, the signal stability of the touch display panel can be improved, and the signal stability of the operating environment for the active stylus can be improved, so that the key performances including the SNR, the linearity and the like of the active stylus can be improved.

In some implementations, in the touch display panel provided by the embodiments of the present disclosure, as shown in FIG. 4, FIG. 9B and FIG. 9C, a first shielding line 31 is provided in the first gap D1. The first shielding line 31 may be grounded. Alternatively, the first shielding line 31 may be loaded with a constant voltage signal. When the first shielding line 31 is loaded with a constant voltage signal or grounded, mutual interference between signals on the first leads 21 and the second leads 22 can be effectively shielded, and the stability of the signals on the first leads 21 and the second leads 22 can be ensured. As shown in FIGS. 4 and 8C, a third shielding line 33 is provided in the third gap D3. The third shielding line 33 may be grounded. Alternatively, the third shielding line 33 may be loaded with a constant voltage signal. When the third shielding line 33 is loaded with a constant voltage signal or grounded, mutual interference between signals on the first leads 21' and the fourth leads 24 can be effectively shielded, and the stability of the signals on the first leads 21' and the fourth leads 24 can be ensured.

Specifically, as shown in FIG. 4, a second shielding line (not shown) is provided in the second gap D2. The second shielding line may be grounded. Alternatively, the second shielding line may be loaded with a constant voltage signal. When the second shielding line is loaded with a constant voltage signal or grounded, mutual interference between signals on the second leads 22' and the third leads 23 can be effectively shielded, and the stability of the signals on the second leads 22' and the third leads 23 can be ensured. A fourth shielding line (not shown) is provided in the fourth gap D4. The fourth shielding line may be grounded. Alternatively, the fourth shielding line may be loaded with a constant voltage signal. When the fourth shielding line is loaded with a constant voltage signal or grounded, mutual interference between signals on the third leads 23' and the fourth leads 24' can be effectively shielded, and the stability of the signals on the third leads 23' and the fourth leads 24' can be ensured.

Specifically, as shown in FIGS. 3, 5, and 6, the first shielding line (not shown) is provided in the first gap D1, and is grounded. The second shielding line (not shown) is provided in the second gap D2, and is grounded. The third shielding line (not shown) is provided in the third gap D3, and is grounded. The fourth shielding line (not shown) is provided in the fourth gap D4, and is grounded.

Specifically, as shown in FIGS. 4, 9A and 9C, the left side of the first binding sub-region B11 corresponds to the region to which the first leads 21 are bonded, the right side of the first binding sub-region B11 corresponds to the region to which the second leads 22 are bonded, and a region to which the first shielding line 31 is bonded corresponds to a region of the first binding sub-region B11 located between the rightmost first lead 21 and the leftmost second lead 22. The first shielding line 31 is led out downward from a central region of the first binding sub-region B11 and is then branched, one branch is routed to the left side to the leftmost end of the first gap D1 around the rightmost first lead 21, and the other branch is routed to the rightmost end of the first gap D1 around the leftmost second lead 22, so that the first shielding line 31 completely isolates the first leads 21 and the second leads 22 from each other and the mutual interference between the signals on the first leads 21 and the second leads 22 can be avoided.

In some embodiments, the second shielding line, the third shielding line, and the fourth shielding line are routed in a same manner as the first shielding line.

In some implementations, as shown in FIG. 3 to FIG. 6, in the touch display panel provided by the embodiments of the present disclosure, some first leads 21 cross (extend) over the first bending region BD1 to the first binding region B1, and the other first leads 21' cross over the second bending region BD2 to the second binding region B2.

Some third leads 23 cross over the first bending region BD1 to the first binding region B1, and the other third leads 23' cross over the second bending region BD2 to the second binding region B2.

The second leads (22 and 22') cross over the first bending region BD1 to the first binding region B1, and the fourth leads (24 and 24') cross over the second bending region BD2 to the second binding region B2. In this way, after the touch display panel is bonded to a flexible printed circuit (FPC), the first binding region B1 and the second binding region B2 may be bent to the back of the display panel, thereby achieving a narrow bezel.

In some implementations, in the touch display panel provided in the embodiments of the present disclosure, as shown in FIGS. 3 to 6, 8D and 9D, a plurality of first bridging lines 41 are provided in the first bending region BD1 and sequentially arranged along the extending direction of the first touch electrodes Tx, and a plurality of second bridging lines 42 are provided in the second bending region BD2 and sequentially arranged along the extending direction of the first touch electrodes Tx. The wiring space of the upper bezel of the touch display panel is abundant and the wiring space of the lower bezel of the touch display panel is limited, so that the number of the second bridging lines 42 electrically connected to each touch lead 2 extending to the second binding region B2 may be less than the number of the first bridging lines 41 electrically connected to each touch lead 2 extending to the first binding region B1.

In some implementations, in the touch display panel provided in the embodiments of the present disclosure, as shown in FIGS. 3 to 6, 8D, and 9D, each of some first leads 21 is electrically connected to corresponding at least three first bridging lines 41, so that a width of the first lead 21 can be increased, an impedance of the first lead 21 can be reduced, and it can be ensured that the first lead 21 is electrically connected to other unbroken first bridging lines 41 when any first bridging line 41 is broken due to bending or other processes, thereby increasing a quantity of touch signals. Each of some third leads 23 is electrically connected to corresponding at least three first bridging lines 41, so that a width of the third lead 23 can be increased, an impedance of the third lead 23 can be reduced, and it can be ensured that the third lead 23 is electrically connected to other unbroken first bridging lines 41 when any first bridging line 41 is broken due to bending or other processes, thereby increasing a quantity of touch signals. Each of the second leads (22 and 22') is electrically connected to corresponding at least three first bridging lines 41, so that a width of the second lead (22 or 22') can be increased, an impedance of the second lead (22 or 22') can be reduced, and it can be ensured that the second lead (22 or 22') is electrically connected to other unbroken first bridging lines 41 when any first bridging line 41 is broken due to bending or other processes, thereby increasing a quantity of touch signals.

Each of the other first leads 21' may be electrically connected to corresponding at least two (e.g., two) second bridging lines 42, so that a width of the first lead 21' may be increased, an impedance of the first lead 21' may be reduced, and it can be ensured that the first lead 21' is electrically connected to other unbroken second bridging lines 42 when any second bridging line 42 is broken, thereby increasing a quantity of touch signals. Each of the other third leads 23' may be electrically connected to corresponding at least two (e.g., two) second bridging lines 42, so that a width of the third lead 23' may be increased, an impedance of the third lead 23' may be reduced, and it can be ensured that the third lead 23' is electrically connected to other unbroken second bridging lines 42 when any second bridging line 42 is broken, thereby increasing a quantity of touch signals. Each of the fourth leads (24 and 24') is electrically connected to corresponding at least two (e.g., two) second bridging lines 42, so that a width of the fourth lead (24 or 24') may be increased, an impedance of the fourth lead (24 or 24') may be reduced, and it can be ensured that the fourth lead (24 or 24') is electrically connected to other unbroken second bridging lines 42 when any second bridging line 42 is broken, thereby increasing a quantity of touch signals.

It should be noted that in the embodiment of the present disclosure, the structure of the touch electrode is the same as the structure shown in FIG. 1 and FIG. 2, and a difference between the embodiment of the present disclosure and the embodiment as shown in FIG. 2 is how to route the touch leads.

In some implementations, in the touch display panel provided in the embodiments of the present disclosure, as shown in FIGS. 1 to 6 and 8E, FIG. 1 is a schematic cross-sectional view of the touch structure 30 along a DD' direction in FIG. 2. Each first touch electrode Tx has a one-piece structure, each second touch electrode Rx includes a plurality of touch sub-electrodes Rx' spaced apart from each other by the plurality of first touch electrodes Tx and a plurality of connecting portions LK, the touch display panel further includes a first insulating layer 70 positioned between the plurality of touch sub-electrodes Rx' and the plurality of connecting portions LK, the plurality of connecting portions LK are close to the base substrate 1, and every two adjacent touch sub-electrodes Rx' are electrically connected to the corresponding connecting portion LK through vias extending through the first insulating layer 70.

The touch display panel includes a first source-drain metal layer (SD1), a second insulating layer (not shown) and a second source-drain metal layer (SD2) sequentially stacked between the base substrate 1 and the plurality of connecting portions LK, wherein the first source-drain metal layer is close to the base substrate 1; namely, the first source-drain metal layer (SD1), the second insulating layer and the second source-drain metal layer (SD2) are located inside the display panel 10 in FIG. 1.

A portion of each of the touch leads 2 (21, 21', 22, 22', 23, 23', 24, 24') corresponding to regions other than the first bending region BD1 and the second bending region BD2 includes a first metal line and a second metal line electrically connected to each other. For example, as shown in FIG. 8E, taking the first lead 21' as an example, a portion of the first lead 21' corresponding to the regions other than the second bending region BD2 includes a first metal line 201 and a second metal line 202 electrically connected to each other, the first metal line 201 may be provided in the same layer as the connecting portions LK shown in FIG. 1, and the second metal line 202 may be provided in the same layer as the first touch electrodes Tx. Therefore, the touch leads 2 adopt double-layer metal wiring, so that a resistance of the touch leads 2 can be reduced, and the signal transmission performance can be improved.

A portion of each of the touch leads 2 (21, 21', 22, 22', 23, 23', 24, 24') corresponding to the first bending region BD1 and the second bending region BD2 is a third metal line located in the second source-drain metal layer (SD2). For example, as shown in FIG. 8E, by taking the first lead 21' as an example, a portion of the first lead 21' corresponding to the second bending region BD2 is a third metal line 203 (i.e., the second bridging lines 42) located in the second source-drain metal layer (SD2), and the first metal line 201 and the third metal line 203 (the second bridging lines 42) are electrically connected to each other through a via extending through the second insulating layer (which may include some planarization layers and passivation layers) between the second source-drain metal layer (SD2) and the connecting portions LK. Alternatively, the second metal line 202 and the third metal line 203 may be electrically connected to each other through a via extending through a third insulating layer (which may include some planarization layers and passivation layers) between the second source-drain metal layer and the first touch electrodes Tx, so that only the second source-drain metal layer (SD2) is adopted for the first bending region BD1 and the second bending region BD2, thereby improving the bending performance.

Figure 7:
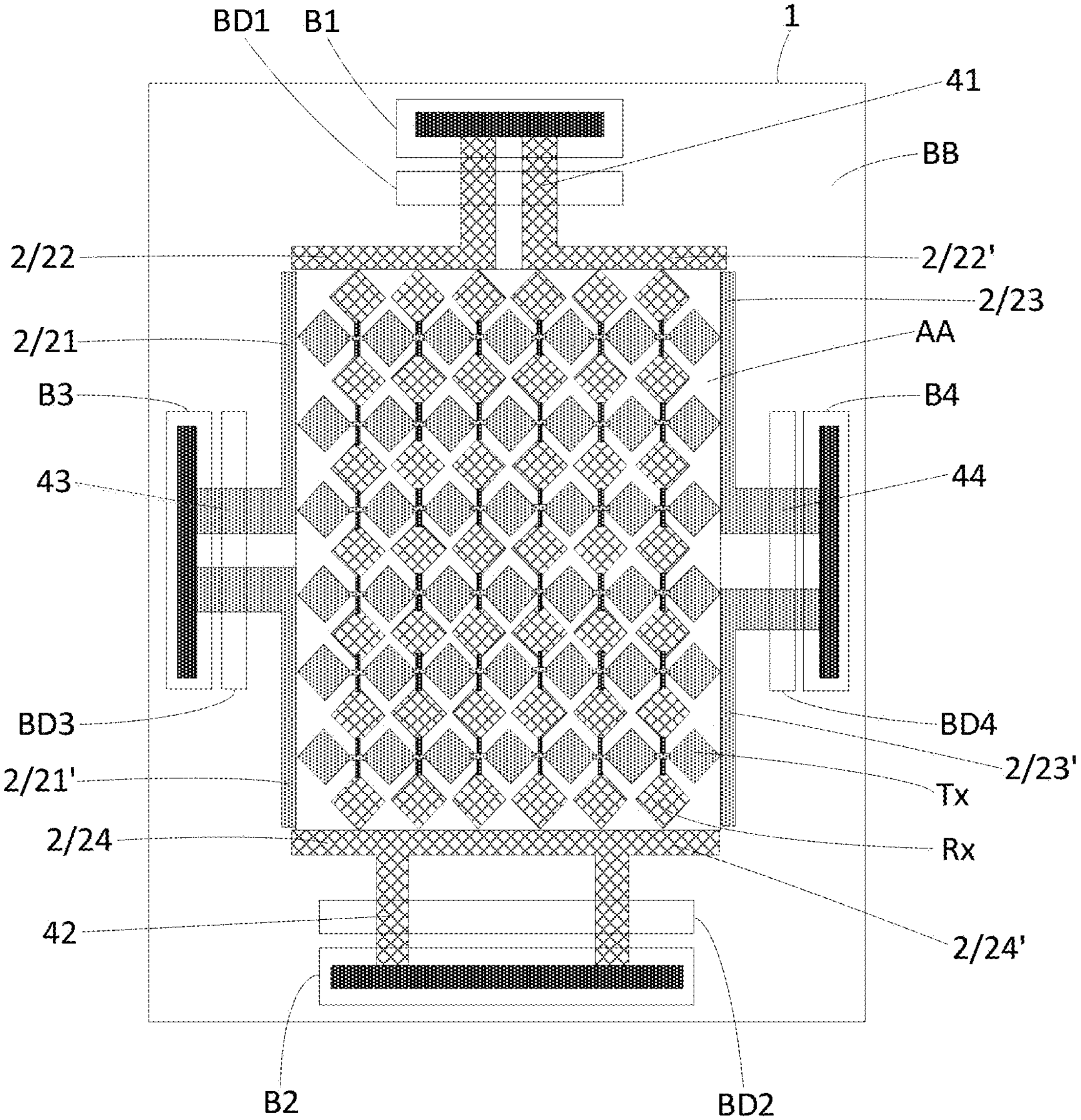
FIG. 7 is a schematic diagram of a structure of another touch display panel according to embodiments of the present disclosure.

In some implementations, in the touch display panel provided in the embodiments of the present disclosure, as shown in FIG. 7, the plurality of touch electrodes include a plurality of first touch electrodes Tx and a plurality of second touch electrodes Rx crossing each other in a horizontal direction and a vertical direction, and the first binding region B1 and the second binding region B2 are respectively located at two ends of the second touch electrodes Rx in an extending direction of the second touch electrodes Rx.

The peripheral region BB further includes a third binding region B3 and a fourth binding region B4, where the third binding region B3 and the fourth binding region B4 are respectively located at two ends of the first touch electrodes Tx in an extending direction of the first touch electrodes Tx. The peripheral region BB further includes: a third bending region BD3 located between the third binding region B3 and the touch display region AA, and a fourth bending region BD4 located between the fourth binding region B4 and the touch display region AA.

The plurality of touch leads 2 include first leads (21 and 21') and second leads (22 and 22'), each of the first leads (21 and 21') is electrically connected to a first end of a corresponding one of the first touch electrodes Tx, and the first leads (21 and 21') extend from the touch display region AA through the third bending region BD3 adjacent to the first leads (21 and 21') to the third binding region B3.

Each of the second leads (22 and 22') is electrically connected to a first end of a corresponding one of the second touch electrodes Rx, and the second leads (22 and 22') extend from the touch display region AA through the first bending region BD1 adjacent to the second leads (22 and 22') to the first binding region B1. Therefore, the first leads (21 and 21') are led out to the third binding region B3 adjacent to the first leads, second ends of the second leads (22 and 22') are led out to the first binding region B1 adjacent to the second leads, so that the RC loading on the first leads (21 and 21') and the second leads (22 and 22') can be reduced, the attenuation of the signal quantity of the active stylus can be reduced, the signal-to-noise ratio of the active stylus can be improved, and the performance index of the active stylus can be achieved.

In some implementations, in the touch display panel provided in the embodiments of the present disclosure, as shown in FIG. 7, the plurality of touch leads 2 further includes third leads (23 and 23') and fourth leads (24 and 24'), each of the third leads (23 and 23') is electrically connected to a second end of a corresponding one of the first touch electrodes Tx, and the third leads (23 and 23') extend from the touch display region AA through the fourth bending region adjacent to the third leads to the fourth binding region B4. Therefore, each first touch electrode Tx adopts a double-end lead. When a touch signal is loaded, the touch signal can be loaded from the first end and the second end of the first touch electrode Tx at the same time, so that the uniformity of the touch signal can be improved, and the touch performance can be improved.

Each of the fourth leads (24 and 24') is electrically connected to a second end of a corresponding one of the second touch electrodes Rx, and the fourth leads (24 and 24') extend from the touch display region AA through the second bending region BD2 adjacent to the fourth leads to both ends of the second binding region B2. Therefore, each second touch electrode Rx adopts a double-end lead. When a touch signal is loaded, the touch signal can be loaded from the first end and the second end of the second touch electrode Rx at the same time, so that the uniformity of the touch signal can be further improved, and the touch performance can be further improved. In addition, the third leads (23 and 23') are led out to the fourth binding region B4 adjacent to the third leads, and second ends of the fourth leads (24 and 24') are led out to the second binding region B2 adjacent to the fourth leads, so that the RC loading on the third leads (23 and 23') and the fourth leads (24 and 24') can be reduced, the attenuation of the signal quantity of the active stylus can be reduced, the signal-to-noise ratio of the active stylus can be improved, and the performance index of the active stylus can be realized.

In some implementations, as shown in FIG. 7, in the touch display panel provided in the embodiments of the present disclosure, the first leads (21 and 21') cross over the third bending region BD3 to the third binding region B3, the second leads (22 and 22') cross over the first bending region BD1 to the first binding region B1, the third leads (23 and 23') cross over the fourth bending region BD4 to the fourth binding region B4, and the fourth leads (24 and 24') cross over the second bending region BD2 to the second binding region B2. In this way, after the touch display panel is bonded to a flexible printed circuit (FPC), the first binding region B1, the second binding region B2, the third binding region B3, and the fourth binding region B4 may be bent to the back of the display panel, so that the narrow bezel can be realized.

In some implementations, in the touch display panel provided in the embodiments of the present disclosure, as shown in FIG. 7, a plurality of first bridging lines 41 are provided in the first bending region BD1 and sequentially arranged along the extending direction of the first touch electrodes Tx, a plurality of second bridging lines 42 are provided in the second bending region BD2 and sequentially arranged along the extending direction of the first touch electrodes Tx, a plurality of third bridging lines 43 are provided in the third bending region BD3 and sequentially arranged along the extending direction of the second touch electrodes Rx, and a plurality of fourth bridging lines 44 are provided in the fourth bending region BD4 and sequentially arranged along the extending direction of the second touch electrodes Rx.

Each first lead (21 and 21') is electrically connected to corresponding at least two third bridging lines 43, so that the width of the first lead (21 and 21') can be increased, the impedance of the first lead (21 and 21') can be reduced, and it can be ensured that the first lead (21 and 21') is electrically connected to other unbroken third bridging lines 43 when any third bridging line 43 is broken, and the touch signal quantity is improved. Each second lead (22 and 22') is electrically connected to corresponding at least two first bridging lines 41, so that the width of the second lead (22 and 22') can be increased, the impedance of the second lead (22 and 22') can be reduced, and it can be ensured that the second lead (22 and 22') is electrically connected to other unbroken first bridging lines 41 when any first bridging line 41 is broken, and the touch signal quantity is improved. Each third lead (23 and 23') is electrically connected to corresponding at least two fourth bridging lines 44, so that the width of the third lead (23 and 23') can be increased, the impedance of the third lead (23 and 23') can be reduced, and it can be ensured that the third lead (23 and 23') is electrically connected to other unbroken fourth bridging lines 44 when any fourth bridging line 44 is broken, and the touch signal quantity is improved. Each fourth lead (24 and 24') is electrically connected to corresponding at least two second bridging lines 42, so that the width of the fourth lead (24 and 24') can be increased, the impedance of the fourth lead (24 and 24') can be reduced, and it can be ensured that the fourth lead (24 and 24') is electrically connected to other unbroken second bridging lines 42 when any second bridging line 42 is broken, and the touch signal quantity can be improved.

In some implementations, as shown in FIGS. 8A and 8B, the touch display panel provided in the embodiments of the present disclosure further includes a low voltage power line VSS located in the peripheral region BB, the low voltage power line VSS is generally provided around the touch region AA and in the same layer as data signal lines in the display panel. The touch leads 2 are led out from the binding regions, display signals (such as data signals and scanning signals) in the display panel are separated and shielded from the touch signals through a low voltage power line VSS, and the touch leads 2 extend above the low voltage power line VSS, pass through the corresponding bending regions and are led into the corresponding binding regions on the upper side of the corresponding bending regions.

In some implementations, in the touch display panel provided in the embodiments of the present disclosure, as shown in FIG. 1 and FIG. 7, each first touch electrode Tx has a one-piece structure, each second touch electrode Rx includes a plurality of touch sub-electrodes Rx' spaced apart from each other by the plurality of first touch electrodes Tx and a plurality of connecting portions LK, the touch display panel further includes a first insulating layer 70 positioned between the plurality of touch sub-electrodes Rx' and the plurality of connecting portions LK, the plurality of connecting portions LK are close to the base substrate 1, and every two adjacent touch sub-electrodes Rx' are electrically connected to the corresponding connecting portion LK through vias extending through the first insulating layer 70.

The touch display panel includes a first source-drain metal layer (SD1), a second insulating layer (not shown) and a second source-drain metal layer (SD2) sequentially stacked between the base substrate 1 and the plurality of connecting portions LK, the first source-drain metal layer is close to the base substrate 1; namely, the first source-drain metal layer (SD1), the second insulating layer and the second source-drain metal layer (SD2) are located inside the display panel 10 in FIG. 1.

A portion of each of the touch leads 2 (21, 21', 22, 22', 23, 23', 24, 24') corresponding to regions other than the first bending region BD1, the second bending region BD2, the third bending region BD3, and the fourth bending region BD4 includes a first metal line and a second metal line electrically connected to each other, the first metal line may be provided in the same layer as the connecting portions LK, and the second metal line may be provided in the same layer as the first touch electrodes Tx. Therefore, the touch leads 2 adopt double-layer metal wiring, so that a resistance of the touch leads 2 can be reduced, and the signal transmission performance can be improved.

A portion of each of the touch leads 2 (21, 21', 22, 22', 23, 23', 24, 24') corresponding to the first bending region BD1, the second bending region BD2, the third bending region BD3, and the fourth bending region BD4 is a third metal line located in the second source-drain metal layer (SD2), the first metal line and the third metal line are electrically connected to each other through a via extending through the second insulating layer (which may include some planarization layers and passivation layers) between the second source-drain metal layer and the connecting portions LK.

Alternatively, the second metal line and the third metal line may be electrically connected to each other through a via extending through a third insulating layer (which may include some planarization layers and passivation layers) between the second source-drain metal layer and the first touch electrodes Tx.

It should be noted that FIGS. 8A to 8D and 9A to 9D in the embodiment of the present disclosure are only used to schematically illustrate a wiring manner of the touch leads, and other layers are not explained in detail, and are the same as those in the related art.

Figure 10:
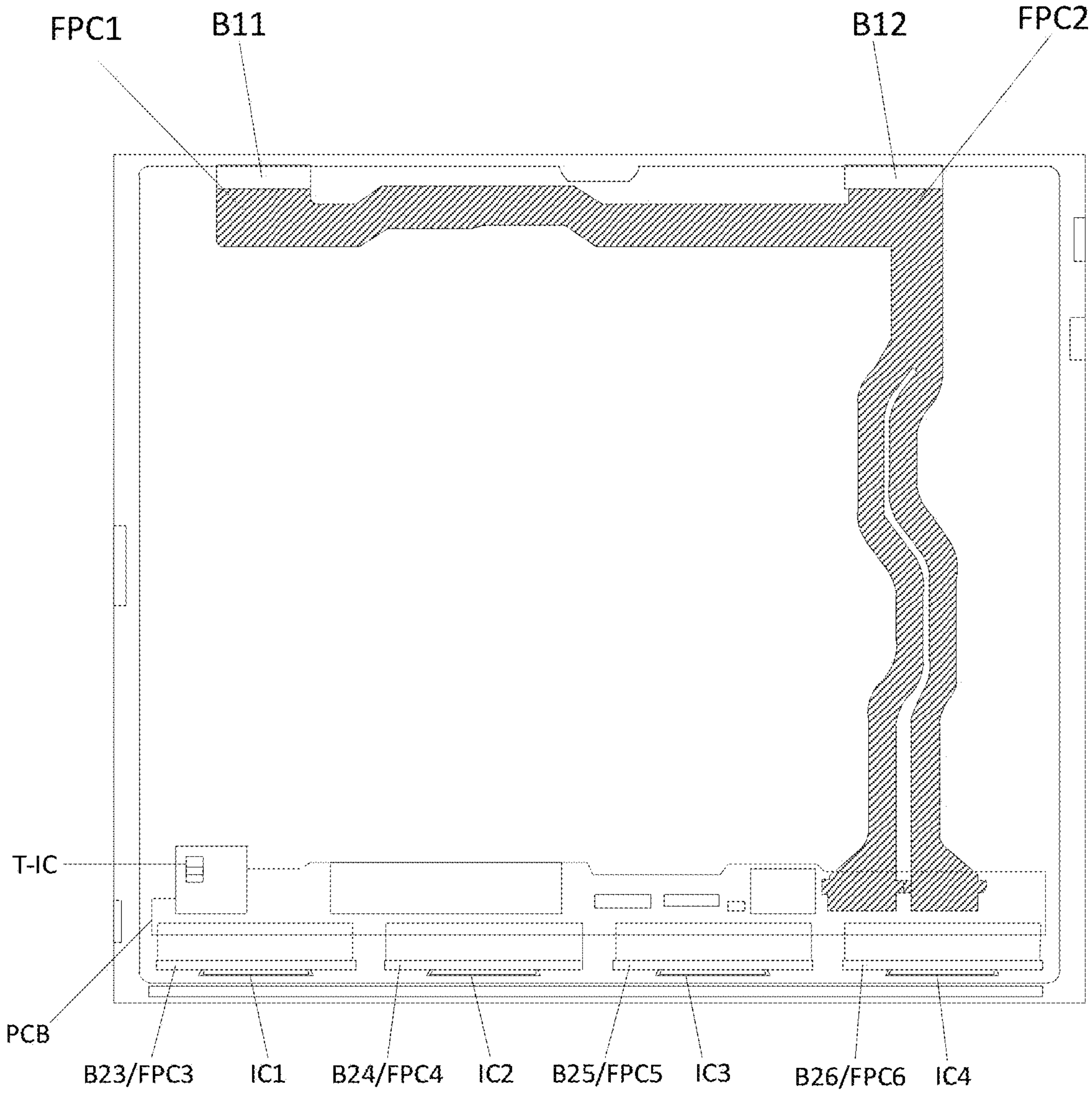
FIG. 10 is a schematic diagram of a back structure of a touch display apparatus according to embodiments of the present disclosure.

Based on the same inventive concept, embodiments of the present disclosure further provide a touch display apparatus, as shown in FIG. 10, including the touch display panel provided in the embodiments of the present disclosure and at least two flexible circuit boards located on the back of the touch display panel, where each binding region of the touch display panel is provided with a plurality of first pads therein, and the touch leads are electrically connected to the corresponding flexible circuit boards through the corresponding first pads. Since the principle of the touch display apparatus for solving the problems is similar to that of the touch display panel, the implementations of the display apparatus may be referred to the implementations of the touch display panel, and repeated descriptions are omitted herein. The touch display apparatus may be: any product or component with a display function, such as a mobile phone, a tablet computer, a television, a display, a notebook computer, a digital photo frame, or a navigator or the like.

In some implementations, FIG. 10 is a schematic diagram of a structure on a back of the touch display apparatus. As shown in FIG. 10, in the touch display apparatus provided in the embodiments of the present disclosure, as an example, the touch display panel in FIG. 10 is the above touch display panel having the structure shown in FIG. 4. That is, the first binding region B1 includes the first binding sub-region B11 and the second binding sub-region B12 which are arranged separate from each other, and the second binding region B2 includes the fifth binding sub-region B23, the sixth binding sub-region B24, the seventh binding sub-region B25 and the eighth binding sub-region B26 which are sequentially arranged along the extending direction of the first touch electrodes Tx and are independently arranged. FIG. 10 shows that the first binding region B1 and the second binding region B2 are both bent to the back of the touch display panel.

The at least two flexible circuit boards include a first flexible circuit board FPC1, a second flexible circuit board FPC2, a third flexible circuit board FPC3, a fourth flexible circuit board FPC4, a fifth flexible circuit board FPC5 and a sixth flexible circuit board FPC6, the touch display apparatus further includes a printed circuit board (PCB) on the back of the touch display panel, and the printed circuit board (PCB) is close to the second binding region B2 and extends along the extending direction of the first touch electrodes Tx.

Terminals at one end of the first flexible circuit board FPC1 are bonded to the first pads in the first binding sub-region B11, terminals at one end of the second flexible circuit board FPC2 are bonded to the first pads in the second binding sub-region B12, and terminals at the other end of the first flexible circuit board FPC1 and terminals at the other end of the second flexible circuit board FPC2 are electrically connected to a portion of the printed circuit board (PCB) close to the eighth binding sub-region B26.

Terminals at one end of the third flexible circuit board FPC3 are bonded to the first pads in the fifth binding sub-region B23, terminals at one end of the fourth flexible circuit board FPC4 are bonded to the first pads in the sixth binding sub-region B24, terminals at one end of the fifth flexible circuit board FPC5 are bonded to the first pads in the seventh binding sub-region B25, and terminals at one end of the sixth flexible circuit board FPC6 are bonded to the first pads in the eighth binding sub-region B26.

Terminals at the other end of the third flexible circuit board FPC3 are bonded to the printed circuit board (PCB), terminals at the other end of the fourth flexible circuit board FPC4 are bonded to the printed circuit board (PCB), terminals at the other end of the fifth flexible circuit board FPC5 are bonded to the printed circuit board (PCB), and terminals at the other end of the sixth flexible circuit board FPC6 are bonded to the printed circuit board (PCB).

In some implementations, in the touch display apparatus provided in the embodiments of the present disclosure, as shown in FIG. 10, traces on the first flexible circuit board FPC1 and the second flexible circuit board FPC2 are required to be led out from one side where the first binding regions (B11, B12) are located to one side where the second binding regions (B23, B24, B25, B26) are located. Therefore, in order to avoid the FPC warping when the bending regions are bent, the branches are adopted when the traces on the first flexible circuit board FPC1 and the traces on the second flexible circuit board FPC2 are routed to the second binding region, that is, a certain gap is left between the traces on the first flexible circuit board FPC1 and the traces on the second flexible circuit board FPC2, and the traces on the first flexible circuit board FPC1 and the traces on the second flexible circuit board FPC2 adopt a serpentine structure and are connected to the printed circuit board PCB below by means of fasteners.

In some implementations, in the touch display apparatus provided in the embodiments of the present disclosure, as shown in FIG. 10, the printed circuit board (PCB) includes a first source driver chip IC1, a second source driver chip IC2, a third source driver chip IC3 and a fourth source driver chip IC4, the first source driver chip IC1 is located in a central region on a side of the third flexible circuit board FPC3 away from the first flexible circuit board FPC1, the second source driver chip IC2 is located in a central region on a side of the fourth flexible circuit board FPC4 away from the first flexible circuit board FPC1, the third source driver chip IC3 is located in a central region on a side of the fifth flexible circuit board FPC5 away from the first flexible circuit board FPC1, and the fourth source driver chip IC4 is located in a central region on a side of the sixth flexible circuit board FPC6 away from the first flexible circuit board FPC1.

The printed circuit board (PCB) further includes a touch driver chip T-IC positioned at a corner of the printed circuit board, the touch driver chip T-IC is close to the third flexible circuit board FPC3, and touch signals are transmitted to the first flexible circuit board FPC1, the second flexible circuit board FPC2, the third flexible circuit board FPC3, the fourth flexible circuit board FPC4, the fifth flexible circuit board FPC5 and the sixth flexible circuit board FPC6 through traces on the printed circuit board (PCB) by the touch driver chip T-IC so as to load the touch signals on the touch leads 2.

In some implementations, the touch display apparatus provided in the embodiments of the present disclosure further includes an active stylus. In the embodiments of the present disclosure, the routing manner of the touch leads is to lead the touch leads out from the first ends of the touch electrodes to the binding regions on the two opposite sides of the touch display panel, so that the RC loading on the touch leads can be reduced, thereby reducing the attenuation of the signal quantity of the active stylus, improving the signal-to-noise ratio of the active stylus, and realizing the performance index of the active stylus. In addition, a major problem in the large-sized OLED display panel can be solved that the active stylus cannot implement the touch function, thereby improving the core competitiveness of the large-sized OLED display product.

It should be noted that in FIG. 10, in the embodiments of the present disclosure, the structure on the back of the touch display apparatus is described by taking the structure shown in FIG. 4 as an example. Alternatively, for the structures shown in FIG. 3 and FIG. 5 to FIG. 7, the structure on the back of the touch display apparatus is designed according to different bonding regions.

Based on the same inventive concept, embodiments of the present disclosure further provide a touch substrate, including a touch region and a non-touch region surrounding the touch region, the non-touch region includes: a first binding region and a second binding region on opposite sides of the touch region, a first bending region between the first binding region and the touch region, and a second bending region between the second binding region and the touch region.

The touch substrate further includes:

A base substrate;

A touch electrode layer on the base substrate and in the touch region, wherein the touch electrode layer includes a plurality of touch electrodes in the same layer and insulated from each other; and A plurality of touch leads on the base substrate, wherein each touch lead is electrically connected to a corresponding one of the plurality of touch electrodes, some touch leads extend from the touch region through the first bending region to the first binding region, and the other touch leads extend from the touch region through the second bending region to the second binding region.

The embodiments of the present disclosure provide the touch substrate, some touch leads are led out to the first binding region, and the other touch leads are led out to the second binding region, and the first binding region and the second binding region are located on two opposite sides of the touch display region. That is, the touch leads in the embodiments of the present disclosure are routed from the touch electrodes to the binding regions on two opposite sides of the touch display panel, so that the RC loading on the touch leads can be reduced, the attenuation of the signal quantity of the active stylus can be reduced, a signal-to-noise ratio of the active stylus can be improved, and the performance index of the active stylus can be realized.

In some implementations, in the touch substrate provided in the embodiments of the present disclosure, the plurality of touch electrodes include a plurality of first touch electrodes and a plurality of second touch electrodes crossing each other in a horizontal direction and a vertical direction, the plurality of touch leads include first leads and second leads, and the first binding region and the second binding region are respectively located at two ends of the plurality of second touch electrodes in an extending direction of the plurality of second touch electrodes.

Each of the first leads is electrically connected to a first end of a corresponding one of the plurality of first touch electrodes, some first leads extend from the touch region through the first bending region to the first binding region, and the other first leads extend from the touch region through the second bending region to the second binding region.

Each of the second leads is electrically connected to a first end of a corresponding one of the plurality of second touch electrodes, and the second leads extend from the touch region through the first bending region adjacent to the second leads to the first binding region.

In some implementations, in the touch substrate provided in the embodiments of the present disclosure, the plurality of touch leads further includes third leads and fourth leads, each of the third leads is electrically connected to a second end of a corresponding one of the plurality of first touch electrodes, some third leads extend from the touch region through the first bending region to the first binding region, and the other third leads extend from the touch region through the second bending region to the second binding region.

Each of the fourth leads is electrically connected to a second end of a corresponding one of the plurality of second touch electrodes, and the fourth leads extend from the touch region through the second bending region adjacent to the fourth leads to the second binding region.

In some implementations, in the touch substrate provided in the embodiments of the present disclosure, the first binding region includes a first binding sub-region and a second binding sub-region that are provided to be separated from each other, the first binding sub-region is close to the first end of the first touch electrode, and the second binding sub-region is close to the second end of the first touch electrode.

Some first leads extend from the touch region through the first bending region to a side of the first binding sub-region close to the first end of the first touch electrode, and some third leads extend from the touch region through the first bending region to a side of the second binding sub-region close to the second end of the first touch electrode.

Some second leads extend from the touch region through the first bending region to a side of the first binding sub-region away from the first end of the first touch electrode, and the other second leads extend from the touch region through the first bending region to a side of the second binding sub-region away from the second end of the first touch electrode.

In some implementations, in the touch substrate provided in the embodiments of the present disclosure, the second binding region includes a fifth binding sub-region, a sixth binding sub-region, a seventh binding sub-region, and an eighth binding sub-region, which are sequentially arranged and provided to be separated from each other along the extending direction of the first touch electrode.

The other first leads extend from the touch region through the second bending region to a side of the fifth binding sub-region close to the first end of the first touch electrode, and the other third leads extend from the touch region through the second bending region to a side of the eighth binding sub-region close to the second end of the first touch electrode.

The fourth leads are sequentially divided into a first group of fourth leads, a second group of fourth leads, a third group of fourth leads and a fourth group of fourth leads along the extending direction of the first touch electrode, the first group of fourth leads extend from the touch region through the second bending region to a side of the fifth binding sub-region away from the first end of the first touch electrode, the second group of fourth leads extend from the touch region through the second bending region to a side of the sixth binding sub-region close to the first end of the first touch electrode, the third group of fourth leads extend from the touch region through the second bending region to a side of the seventh binding sub-region close to the second end of the first touch electrode, and the fourth group of fourth leads extends from the touch region through the second bending region to a side of the eighth binding sub-region away from the second end of the first touch electrode.

It should be noted that for the touch substrate provided by the embodiments of the present disclosure, reference is made to the description of the routing manner of the touch leads in the touch display panel, and details are not repeated herein.

The embodiments of the present disclosure provide a touch substrate, a touch display panel and a touch display apparatus, some touch leads are led out to the first binding region, and the other touch leads are led out to the second binding region, and the first binding region and the second binding region are located on two opposite sides of the touch display region. That is, the touch leads in the embodiments of the present disclosure are routed from the touch electrodes to the binding regions on two opposite sides of the touch display panel, so that the RC loading on the touch leads can be reduced, the attenuation of the signal quantity of the active stylus can be reduced, a signal-to-noise ratio of the active stylus can be improved, and the performance index of the active stylus can be realized.

While preferred embodiments of the present disclosure have been described, additional changes and modifications in these embodiments may occur to one of ordinary skill in the art once they learn of the basic inventive concepts. Therefore, it is intended that the appended claims are interpreted as including the preferred embodiments and all changes and modifications that fall within the scope of the present disclosure.

It will be apparent to one of ordinary skill in the art that, various changes and modifications may be made in the embodiments of the present disclosure without departing from the spirit and scope of the present disclosure. Thus, if these changes and modifications of the embodiments of the present disclosure fall within the scope of the claims of the present disclosure and their equivalents, the present disclosure is also intended to include these changes and modifications.

What is claimed is:

1. A touch display panel, comprising a touch display region and a peripheral region surrounding the touch display region, wherein the peripheral region comprises: a second binding region on a side of the touch display region, and a second bending region between the second binding region and the touch display region;

the touch display panel further comprises:

a base substrate;

a touch electrode layer on the base substrate and in the touch display region, wherein the touch electrode layer comprises a plurality of touch electrodes in a same layer and insulated from each other; and a plurality of touch leads on the base substrate, wherein each touch lead is electrically connected to a corresponding one of the plurality of touch electrodes, some touch leads extend from the touch display region through the second bending region to the second binding region, and are bent to the back of the touch display panel in the second bending region, wherein the plurality of touch electrodes comprise a plurality of first touch electrodes and a plurality of second touch electrodes crossing each other in a horizontal direction and a vertical direction, the plurality of touch leads comprise first leads, and the second binding region is located at an end of the plurality of second touch electrodes in an extending direction of the plurality of second touch electrodes;

each of the first leads is electrically connected to a first end of a corresponding one of the plurality of first touch electrodes, some first leads extend from the touch display region through the second bending region to the second binding region; wherein the plurality of touch leads further comprises third leads and fourth leads, each of the third leads is electrically connected to a second end of a corresponding one of the plurality of first touch electrodes, some third leads extend from the touch display region through the second bending region to the second binding region; and each of the fourth leads is electrically connected to a second end of a corresponding one of the plurality of second touch electrodes, and the fourth leads extend from the touch display region through the second bending region adjacent to the fourth leads to the second binding region, and wherein a gap between the first lead electrically connected to the first touch electrode closest to the second end of the second touch electrode and the fourth lead electrically connected to the second touch electrode closest to the first end of the first touch electrode is a third gap, and a width of the third gap is greater than or equal to 70 μm; and a gap between the third lead electrically connected to the first touch electrode closest to the second end of the second touch electrode and the fourth lead electrically connected to the second touch electrode closest to the second end of the first touch electrode is a fourth gap, and a width of the fourth gap is greater than or equal to 70 μm.

2. The touch display panel of claim 1, wherein the second binding region comprises a third binding sub-region and a fourth binding sub-region that are independently provided, the third binding sub-region is close to the first end of the first touch electrode, and the fourth binding sub-region is close to the second end of the first touch electrode;

the some first leads extend from the touch display region through the second bending region to a side of the third binding sub-region close to the first end of the first touch electrode, and the some third leads extend from the touch display region through the second bending region to a side of the fourth binding sub-region close to the second end of the first touch electrode; and some fourth leads extend from the touch display region through the second bending region to a side of the third binding sub-region away from the first end of the first touch electrode, and the other fourth leads extend from the touch display region through the second bending region to a side of the fourth binding sub-region away from the second end of the first touch electrode.

3. The touch display panel of claim 1, wherein the second binding region comprises a fifth binding sub-region, a sixth binding sub-region, a seventh binding sub-region, and an eighth binding sub-region, which are sequentially arranged and independently provided along the extending direction of the first touch electrode;

the some first leads extend from the touch display region through the second bending region to a side of the fifth binding sub-region close to the first end of the first touch electrode, and the some third leads extend from the touch display region through the second bending region to a side of the eighth binding sub-region close to the second end of the first touch electrode; and the fourth leads are sequentially divided into a first group of fourth leads, a second group of fourth leads, a third group of fourth leads and a fourth group of fourth leads along the extending direction of the first touch electrode, the first group of fourth leads extend from the touch display region through the second bending region to a side of the fifth binding sub-region away from the first end of the first touch electrode, the second group of fourth leads extend from the touch display region through the second bending region to a side of the sixth binding sub-region close to the first end of the first touch electrode, the third group of fourth leads extend from the touch display region through the second bending region to a side of the seventh binding sub-region close to the second end of the first touch electrode, and the fourth group of fourth leads extend from the touch display region through the second bending region to a side of the eighth binding sub-region away from the second end of the first touch electrode.

4. The touch display panel of claim 1, wherein the second binding region comprises a ninth binding sub-region, a tenth binding sub-region, an eleventh binding sub-region, and a twelfth binding sub-region sequentially arranged and independently provided along the extending direction of the first touch electrode;

the some first leads extend from the touch display region through the second bending region to a side of the ninth binding sub-region close to the first end of the first touch electrode, and the some third leads extend from the touch display region through the second bending region to a side of the twelfth binding sub-region close to the second end of the first touch electrode; and the fourth leads are sequentially divided into a fifth group of fourth leads, a sixth group of fourth leads, a seventh group of fourth leads, and an eighth group of fourth leads along the extending direction of the first touch electrode, the fifth group of fourth leads extend from the touch display region through the second bending region to a side of the ninth binding sub-region away from the first end of the first touch electrode, the sixth group of fourth leads extend from the touch display region through the second bending region to a side of the tenth binding sub-region close to the first end of the first touch electrode, the seventh group of fourth leads extend from the touch display region through the second bending region to a side of the eleventh binding sub-region close to the second end of the first touch electrode, and the eighth group of fourth leads extend from the touch display region through the second bending region to a side of the twelfth binding sub-region away from the second end of the first touch electrode.

5. The touch display panel of claim 1, wherein the second binding region is in a central region of the peripheral region at the second end of the second touch electrode, and is divided into a fifth region, a sixth region, a seventh region and an eighth region sequentially arranged along the extending direction of the first touch electrode, and the fifth region is close to the first end of the first touch electrode;

the some first leads extend from the touch display region through the second bending region to the fifth region, and the some third leads extend from the touch display region through the second bending region to the eighth region; and some fourth leads extend from the touch display region through the second bending region to the sixth region, and the other fourth leads extend from the touch display region through the second bending region to the seventh region.

6. The touch display panel of claim 1, wherein the third gap is provided with a third shielding line therein which is grounded, and the fourth gap is provided with a fourth shielding line therein which is grounded.

7. The touch display panel of claim 1, wherein the some first leads cross over the second bending region to the second binding region;

the some third leads cross over the second bending region to the second binding region; and the fourth leads cross over the second bending region to the second binding region.

8. The touch display panel of claim 7, wherein the touch display panel further comprises a plurality of second bridging lines in the second bending region and sequentially arranged along the extending direction of the first touch electrode.

9. The touch display panel of claim 8, wherein each of the some first leads is electrically connected to corresponding at least two second bridging lines, each of the some third leads is electrically connected to corresponding at least two second bridging lines, and each of the fourth leads is electrically connected to corresponding at least two second bridging lines.

10. The touch display panel of claim 9, wherein each first touch electrode has a one-piece structure, each second touch electrode comprises a plurality of touch sub-electrodes spaced apart from each other by the plurality of first touch electrodes and a plurality of connecting portions, the touch display panel further comprises a first insulating layer between the plurality of touch sub-electrodes and the plurality of connecting portions, the plurality of connecting portions are close to the base substrate, and every two adjacent touch sub-electrodes are electrically connected to the corresponding connecting portion through vias extending through the first insulating layer;

the touch display panel comprises a first source-drain metal layer, a second insulating layer and a second source-drain metal layer sequentially stacked between the base substrate and the plurality of connecting portions, wherein the first source-drain metal layer is close to the base substrate;

a portion of each of the plurality of touch leads corresponding to regions other than the second bending region comprises a first metal line and a second metal line electrically connected to each other, the first metal line is in a same layer as the plurality of connecting portions, and the second metal line is in a same layer as the plurality of first touch electrodes; and a portion of each of the plurality of touch leads corresponding to the second bending region is a third metal line in the second source-drain metal layer, the first metal line and the third metal line are electrically connected to each other through a via extending through the second insulating layer between the second source-drain metal layer and the plurality of connecting portions; or the second metal line and the third metal line are electrically connected to each other through a via extending through a third insulating layer between the second source-drain metal layer and the plurality of first touch electrodes.

11. The touch display panel of claim 1, wherein the peripheral region further comprises a third binding region and a fourth binding region, wherein the third binding region and the fourth binding region are respectively located at two ends of the first touch electrodes in an extending direction of the first touch electrodes, and the peripheral region further comprises: a third bending region between the third binding region and the touch display region, and a fourth bending region between the fourth binding region and the touch display region; and the other first leads extend from the touch display region through the third bending region adjacent to the first leads to the third binding region.

12. The touch display panel of claim 11, wherein the other third leads extend from the touch display region through the fourth bending region adjacent to the third leads to the fourth binding region.

13. The touch display panel of claim 12, wherein the other first leads cross over the third bending region to the third binding region, the other third leads cross over the fourth bending region to the fourth binding region, and the fourth leads cross over the second bending region to the second binding region.

14. The touch display panel of claim 13, wherein the touch display panel further comprises a plurality of second bridging lines in the second bending region and sequentially arranged along the extending direction of the first touch electrode, a plurality of third bridging lines in the third bending region and sequentially arranged along the extending direction of the second touch electrode, and a plurality of fourth bridging lines in the fourth bending region and sequentially arranged along the extending direction of the second touch electrode; and each first lead of the other first leads is electrically connected to corresponding at least two third bridging lines, each third lead of the other third leads is electrically connected to corresponding at least two fourth bridging lines, and each fourth lead is electrically connected to corresponding at least two second bridging lines.

15. The touch display panel of claim 14, wherein each first touch electrode has a one-piece structure, each second touch electrode comprises a plurality of touch sub-electrodes spaced apart from each other by the plurality of first touch electrodes and a plurality of connecting portions, the touch display panel further comprises a first insulating layer between the plurality of touch sub-electrodes and the plurality of connecting portions, the plurality of connecting portions are close to the base substrate, and every two adjacent touch sub-electrodes are electrically connected to the corresponding connecting portion through vias extending through the first insulating layer;

the touch display panel comprises a first source-drain metal layer, a second insulating layer and a second source-drain metal layer sequentially stacked between the base substrate and the plurality of connecting portions, wherein the first source-drain metal layer is close to the base substrate;

a portion of each of the plurality of touch leads corresponding to regions other than the second bending region, the third bending region, and the fourth bending region comprises a first metal line and a second metal line electrically connected to each other, the first metal line is in a same layer as the plurality of connecting portions, and the second metal line is in a same layer as the plurality of first touch electrodes; and a portion of each of the plurality of touch leads corresponding to the second bending region, the third bending region, and the fourth bending region is a third metal line in the second source-drain metal layer, the first metal line and the third metal line are electrically connected to each other through a via extending through the second insulating layer between the second source-drain metal layer and the plurality of connecting portions; or the second metal line and the third metal line are electrically connected to each other through a via extending through a third insulating layer between the second source-drain metal layer and the plurality of first touch electrodes.

16. A touch display apparatus, comprising the touch display panel of claim 1 and at least two flexible circuit boards on the back of the touch display panel, wherein each binding region of the touch display panel is provided with a plurality of first pads therein, and the touch leads are electrically connected to the corresponding flexible circuit boards through the plurality of first pads, respectively.

17. The touch display apparatus of claim 16, wherein the second binding sub-region which are independently arranged, and the second binding region comprises a fifth binding sub-region, a sixth binding sub-region, a seventh binding sub-region and an eighth binding sub-region which are sequentially arranged along the extending direction of the first touch electrode and are independently arranged;

the at least two flexible circuit boards comprise a second flexible circuit board, a third flexible circuit board, a fourth flexible circuit board, a fifth flexible circuit board and a sixth flexible circuit board, the second flexible circuit board is on a side of the touch display region away from the second binding region, and the third flexible circuit board, the fourth flexible circuit board, the fifth flexible circuit board and the sixth flexible circuit board are closer to the second binding region, the touch display apparatus further comprises a printed circuit board on the back of the touch display panel, and the printed circuit board is close to the second binding region and extends along the extending direction of the first touch electrode;

terminals at one end of the second flexible circuit board are bonded to the first pads in the second binding sub-region, and terminals at the other end of the second flexible circuit board are electrically connected to a portion of the printed circuit board close to the eighth binding sub-region;

terminals at one end of the third flexible circuit board are bonded to the first pads in the fifth binding sub-region, terminals at one end of the fourth flexible circuit board are bonded to the first pads in the sixth binding sub-region, terminals at one end of the fifth flexible circuit board are bonded to the first pads in the seventh binding sub-region, and terminals at one end of the sixth flexible circuit board are bonded to the first pads in the eighth binding sub-region; and terminals at the other end of the third flexible circuit board are bonded to the printed circuit board, terminals at the other end of the fourth flexible circuit board are bonded to the printed circuit board, terminals at the other end of the fifth flexible circuit board are bonded to the printed circuit board, and terminals at the other end of the sixth flexible circuit board are bonded to the printed circuit board.

18. The touch display apparatus of claim 17, wherein the printed circuit board comprises a first source driver chip, a second source driver chip, a third source driver chip and a fourth source driver chip, the first source driver chip is in a central region on a side of the third flexible circuit board away from the second flexible circuit board, the second source driver chip is in a central region on a side of the fourth flexible circuit board away from the second flexible circuit board, the third source driver chip is in a central region on a side of the fifth flexible circuit board away from the second flexible circuit board, and the fourth source driver chip is in a central region on a side of the sixth flexible circuit board away from the second flexible circuit board; and the printed circuit board further comprises a touch driver chip at a corner of the printed circuit board, the touch driver chip is close to the third flexible circuit board, and touch signals are transmitted to the second flexible circuit board, the third flexible circuit board, the fourth flexible circuit board, the fifth flexible circuit board and the sixth flexible circuit board through traces on the printed circuit board by the touch driver chip.

19. The touch display apparatus of claim 16, further comprising an active stylus.

20. A touch substrate, comprising a touch region and a non-touch region surrounding the touch region, wherein the non-touch region comprises: a second binding region on a side of the touch region, and a second bending region between the second binding region and the touch region;

the touch substrate further comprises:

a base substrate;

a touch electrode layer on the base substrate and in the touch region, wherein the touch electrode layer comprises a plurality of touch electrodes in a same layer and insulated from each other; and a plurality of touch leads on the base substrate, wherein each touch lead is electrically connected to a corresponding one of the plurality of touch electrodes, some touch leads extend from the touch region through the second bending region to the second binding region, wherein the plurality of touch electrodes comprise a plurality of first touch electrodes and a plurality of second touch electrodes crossing each other in a horizontal direction and a vertical direction, the plurality of touch leads comprise first leads, and the second binding region is located at an end of the plurality of second touch electrodes in an extending direction of the plurality of second touch electrodes;

each of the first leads is electrically connected to a first end of a corresponding one of the plurality of first touch electrodes, some first leads extend from the touch region through the second bending region to the second binding region; wherein the plurality of touch leads further comprises third leads and fourth leads, each of the third leads is electrically connected to a second end of a corresponding one of the plurality of first touch electrodes, some third leads extend from the touch region through the second bending region to the second binding region; and each of the fourth leads is electrically connected to a second end of a corresponding one of the plurality of second touch electrodes, and the fourth leads extend from the touch region through the second bending region adjacent to the fourth leads to the second binding region; and wherein a gap between the first lead electrically connected to the first touch electrode closest to the second end of the second touch electrode and the fourth lead electrically connected to the second touch electrode closest to the first end of the first touch electrode is a third gap, and a width of the third gap is greater than or equal to 70 μm; and a gap between the third lead electrically connected to the first touch electrode closest to the second end of the second touch electrode and the fourth lead electrically connected to the second touch electrode closest to the second end of the first touch electrode is a fourth gap, and a width of the fourth gap is greater than or equal to 70 μm.

* * * * *